(12) United States Patent
Bakr et al.

(10) Patent No.: US 10,971,690 B2
(45) Date of Patent: Apr. 6, 2021

(54) SOLAR CELLS, STRUCTURES INCLUDING ORGANOMETALLIC HALIDE PEROVSKITE MONOCRYSTALLINE FILMS, AND METHODS OF PREPARATION THEREOF

(71) Applicant: King Abdullah University of Science and Technology, Thuwal (SA)

(72) Inventors: Osman M. Bakr, Thuwal (SA); Wei Peng, Thuwal (SA); Lingfei Wang, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 309 days.

(21) Appl. No.: 15/754,733

(22) PCT Filed: Aug. 15, 2016

(86) PCT No.: PCT/IB2016/054892
§ 371 (c)(1),
(2) Date: Feb. 23, 2018

(87) PCT Pub. No.: WO2017/033092
PCT Pub. Date: Mar. 2, 2017

(65) Prior Publication Data
US 2018/0248142 A1    Aug. 30, 2018

Related U.S. Application Data

(60) Provisional application No. 62/208,923, filed on Aug. 24, 2015.

(51) Int. Cl.
*H01L 31/0392* (2006.01)
*H01L 51/42* (2006.01)
(Continued)

(52) U.S. Cl.
CPC .......... *H01L 51/4206* (2013.01); *C23C 14/06* (2013.01); *H01L 31/0392* (2013.01);
(Continued)

(58) Field of Classification Search
CPC ................ H01L 31/00–078; Y02E 10/50–60
(Continued)

(56) References Cited

U.S. PATENT DOCUMENTS 9,082,992 B2    7/2015 Guo et al.
2003/0170918 A1  9/2003 Dehaven et al.
(Continued)

FOREIGN PATENT DOCUMENTS

WO    WO2013171520    11/2013

OTHER PUBLICATIONS

International Search Report and Written Opinion for PCT/IB2016/054892, dated Nov. 16, 2016.
(Continued)

*Primary Examiner* — Bach T Dinh
(74) *Attorney, Agent, or Firm* — Billion & Armitage; Gregory S. Schwartz

(57) ABSTRACT

Embodiments of the present disclosure provide for solar cells including an organometallic halide perovskite monocrystalline film (see FIG. 1.1B), other devices including the organometallic halide perovskite monocrystalline film, methods of making organometallic halide perovskite monocrystalline film, and the like.

6 Claims, 12 Drawing Sheets

(51) Int. Cl.
*C23C 14/06* (2006.01)
*H01L 31/07* (2012.01)
*H01L 51/00* (2006.01)

(52) U.S. Cl.
CPC .......... *H01L 31/07* (2013.01); *H01L 51/0002* (2013.01); *H01L 51/0094* (2013.01); *H01L 2251/308* (2013.01); *Y02E 10/549* (2013.01)

(58) Field of Classification Search
USPC .................................................. 136/243–265
See application file for complete search history.

(56) References Cited

U.S. PATENT DOCUMENTS

2015/0144196 A1    5/2015   Irwin et al.
2016/0248028 A1*   8/2016   Huang ................ H01L 51/0002

OTHER PUBLICATIONS

Dong, "Elctron-hole diffusion lengths > 175 m mm in solution-grown CH3NH3Pbl 3 single crystals", Science, vol. 347, No. 6225, Jan. 29, 2015, Feb. 27, 2015, pp. 967-970.

Dowben, "Low trap-state density and long carrier diffusion in organolead trihalide perovskite single crystls", University of Nebraska—Lincoln DigitalCommons@University of Nebraska—Lincoln, Science, Jan. 30, 2015, pp. 1-26.

Dymshits, et al., "High voltage in hole conductor free organo metal halide perovskite solar cells", Journal of Materials Chemistry A: Materials for Energy and Sustainability, vol. 2, No. 48, Oct. 22, 2014, pp. 20776-20781.

Gamliel, et al., "Micrometer Sized Perovskite Crystals in Planar Hole Conductor Free Solar Cells", Journal of Physical Chemistry C, vol. 119, No. 34, Aug. 14, 2015, pp. 19722-19728.

* cited by examiner

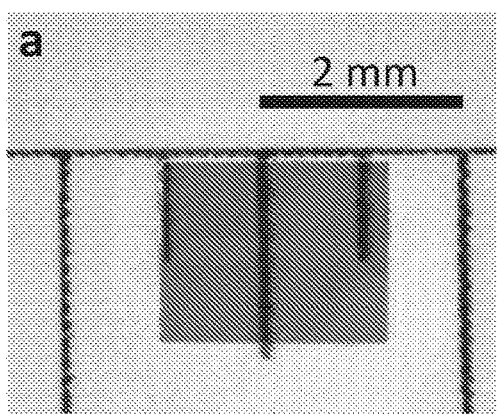
Fig. 1.1A
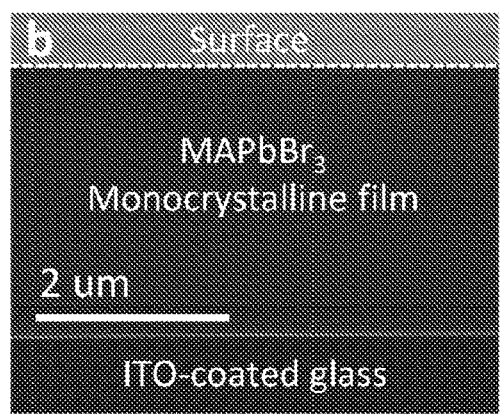
Fig. 1.1B
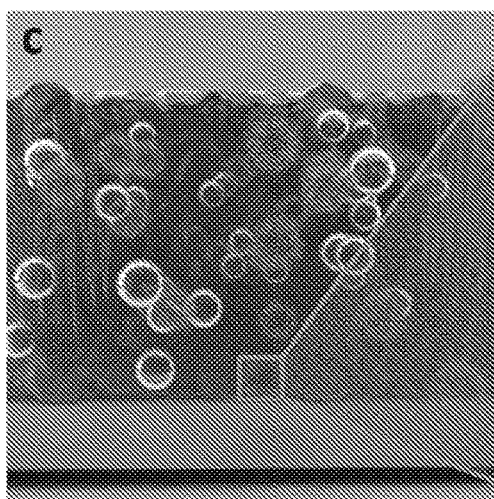
Fig. 1.1C
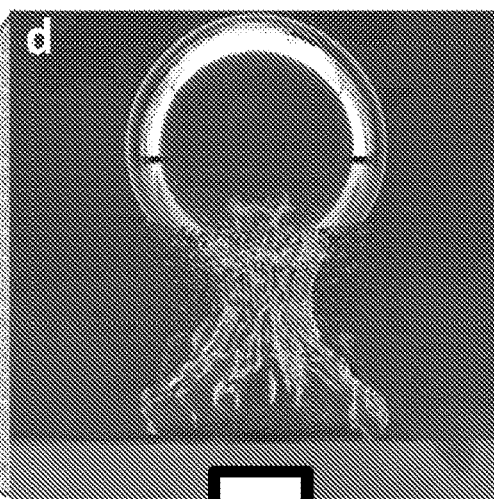
Fig. 1.1D
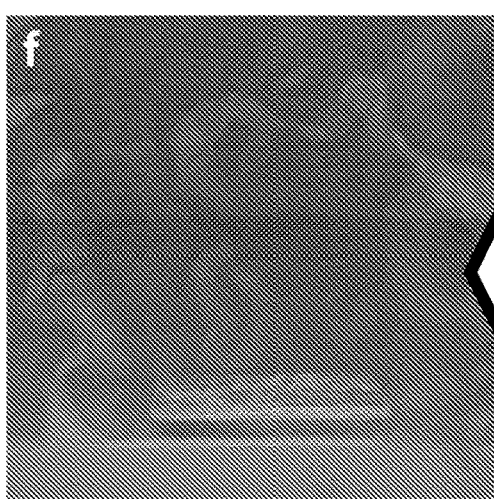
Fig. 1.1F
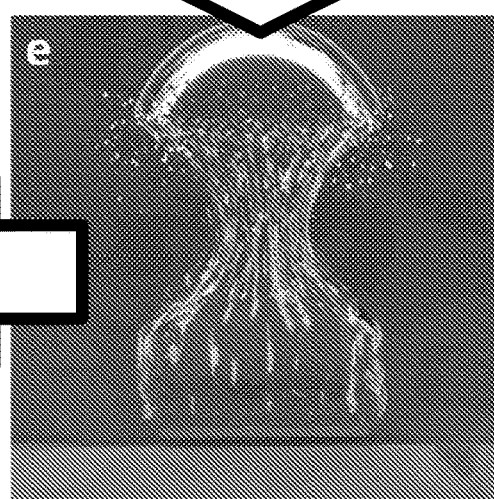
Fig. 1.1E

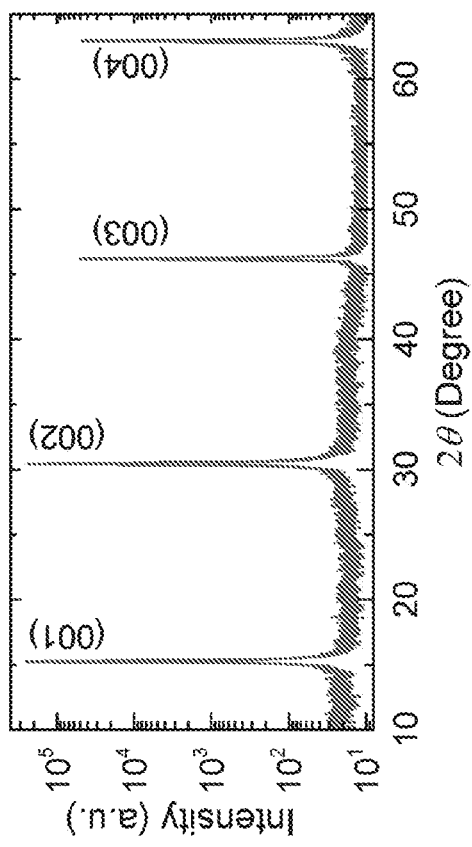
Fig. 1.2A
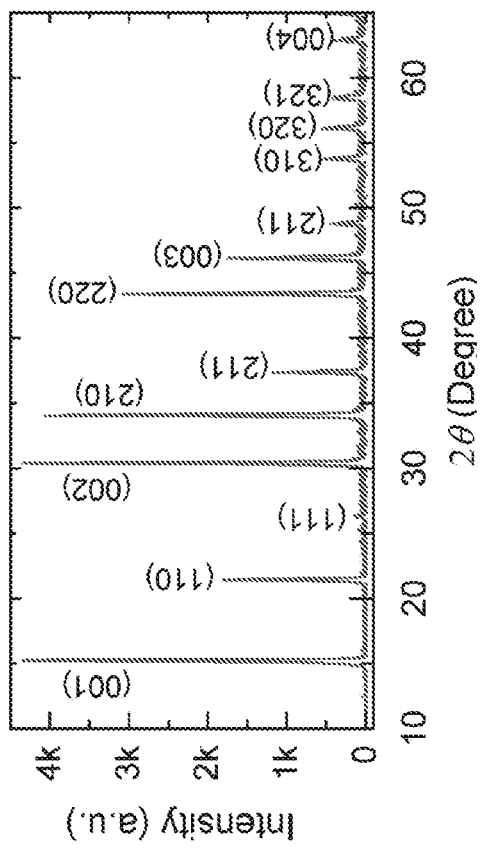
Fig. 1.2C
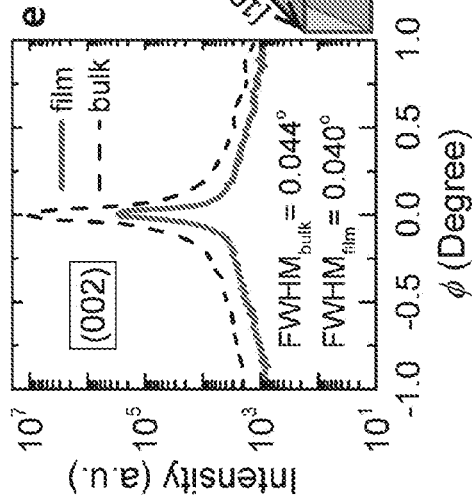
Fig. 1.2B
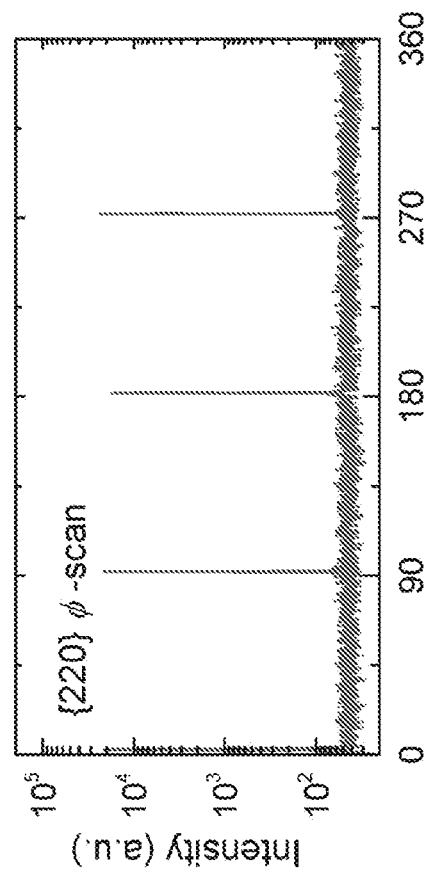
Fig. 1.2D
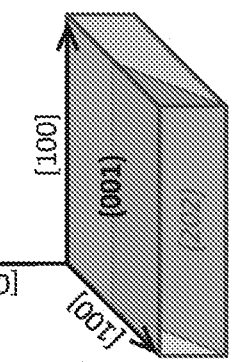
Fig. 1.2E

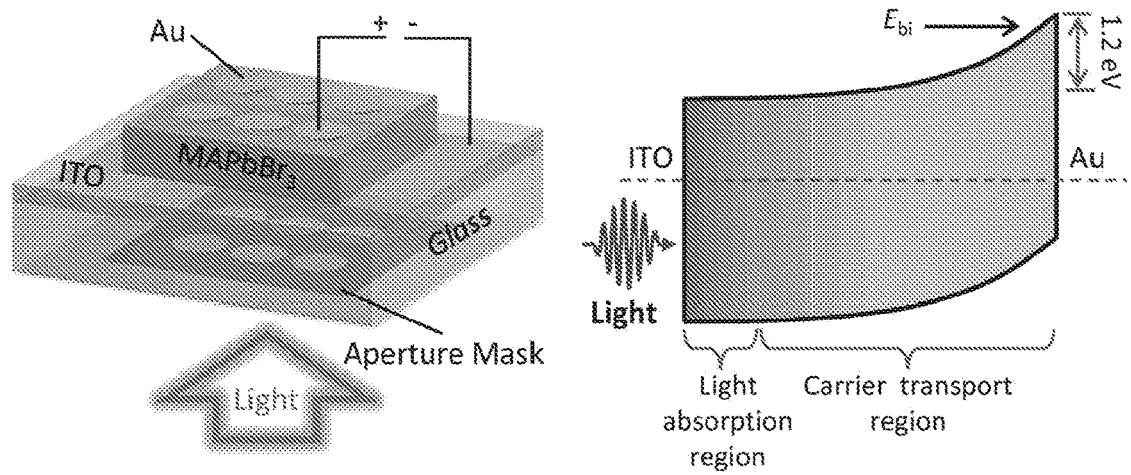
Fig. 1.3A　　　Fig. 1.3B
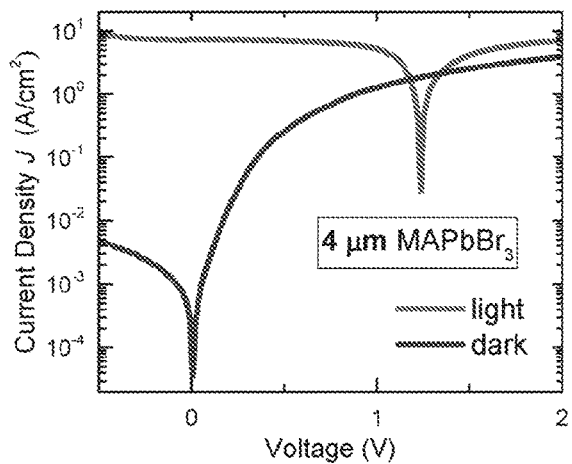　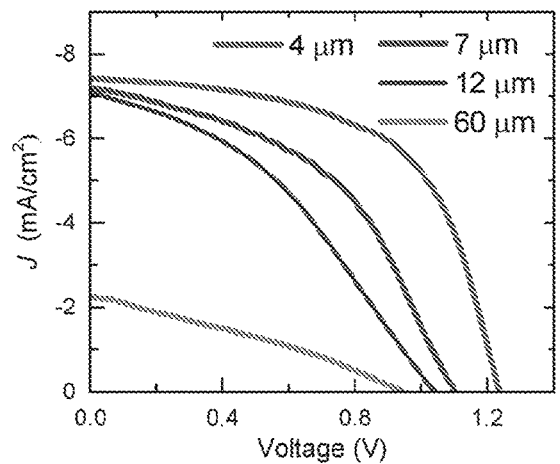
Fig. 1.3C　　　Fig. 1.3D
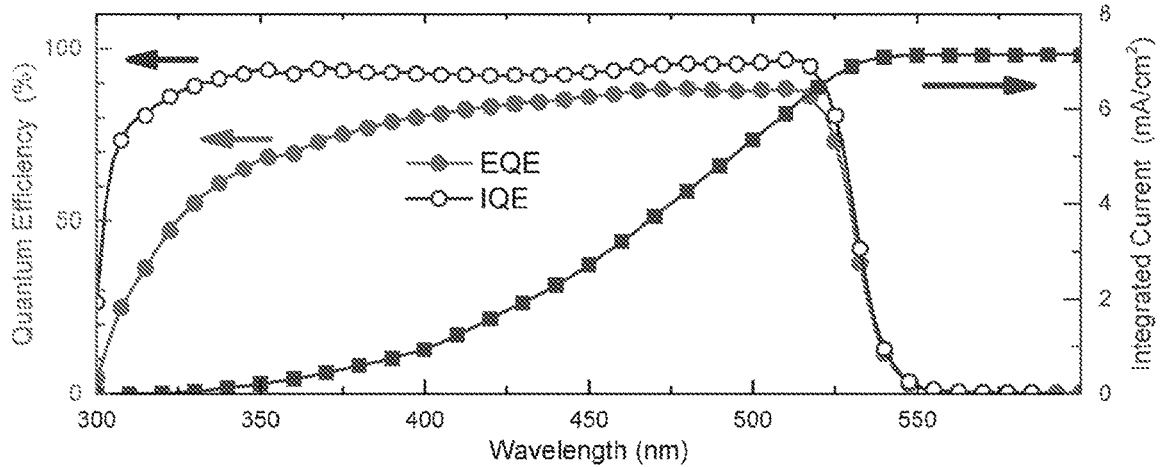
Fig. 1.3E

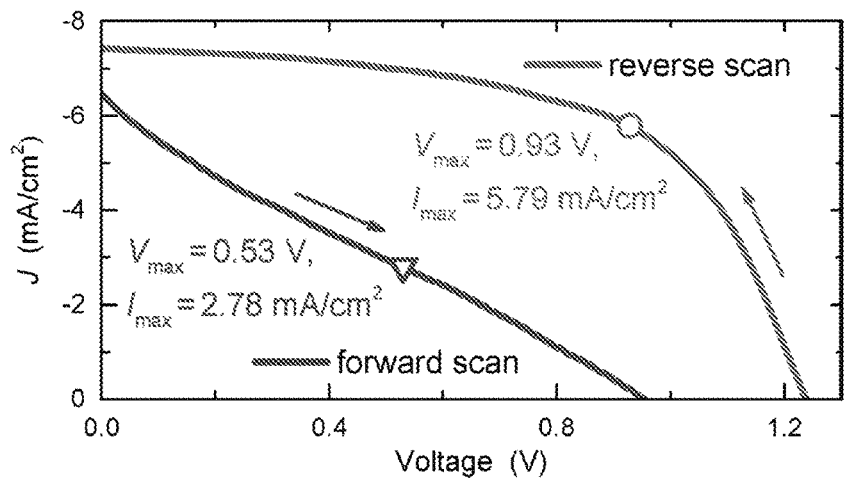
Fig. 1.4A
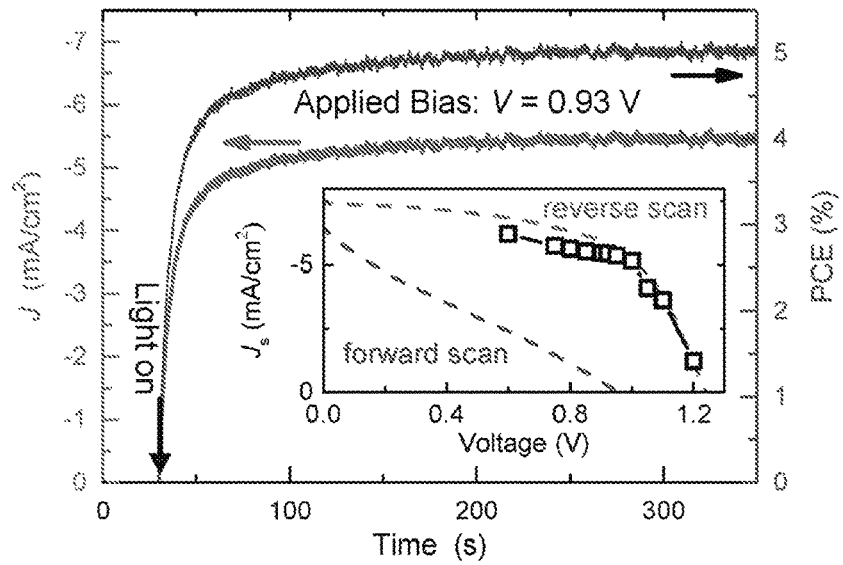
Fig. 1.4B
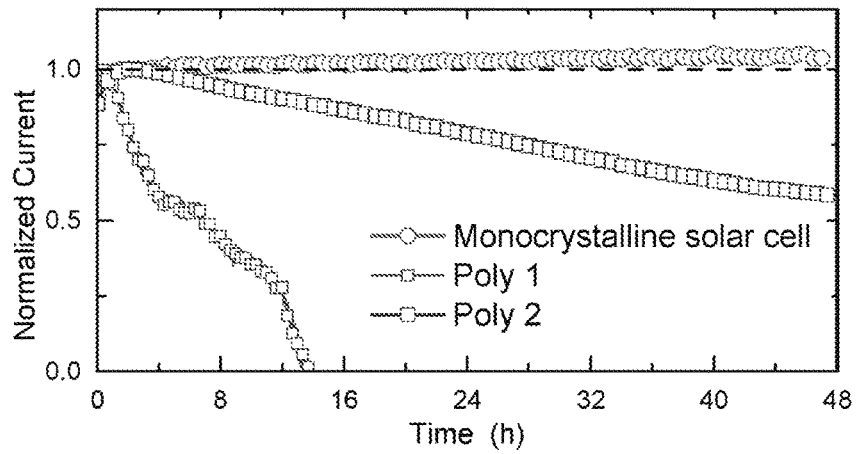
Fig. 1.4C

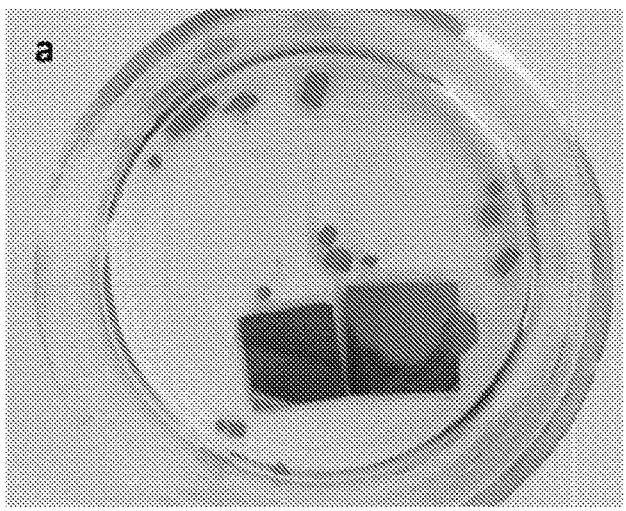
Fig. 1.5A
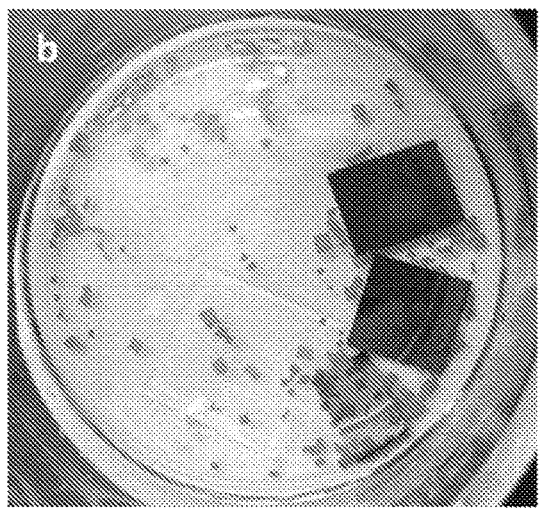
Fig. 1.5B
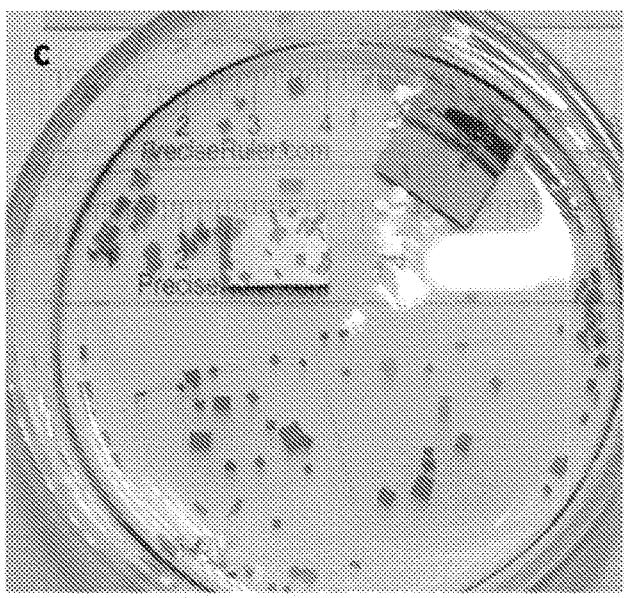
Fig. 1.5C
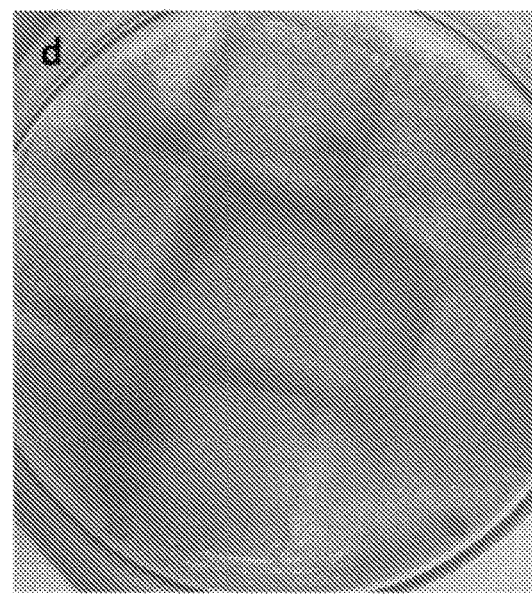
Fig. 1.5D

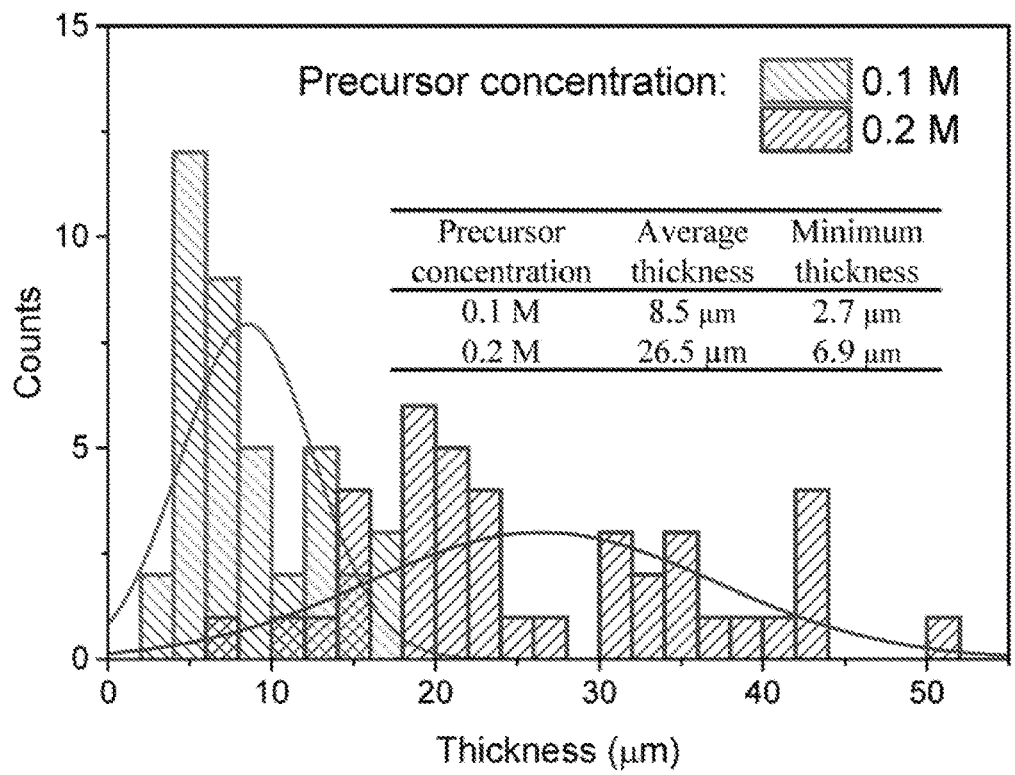
Fig. 1.6
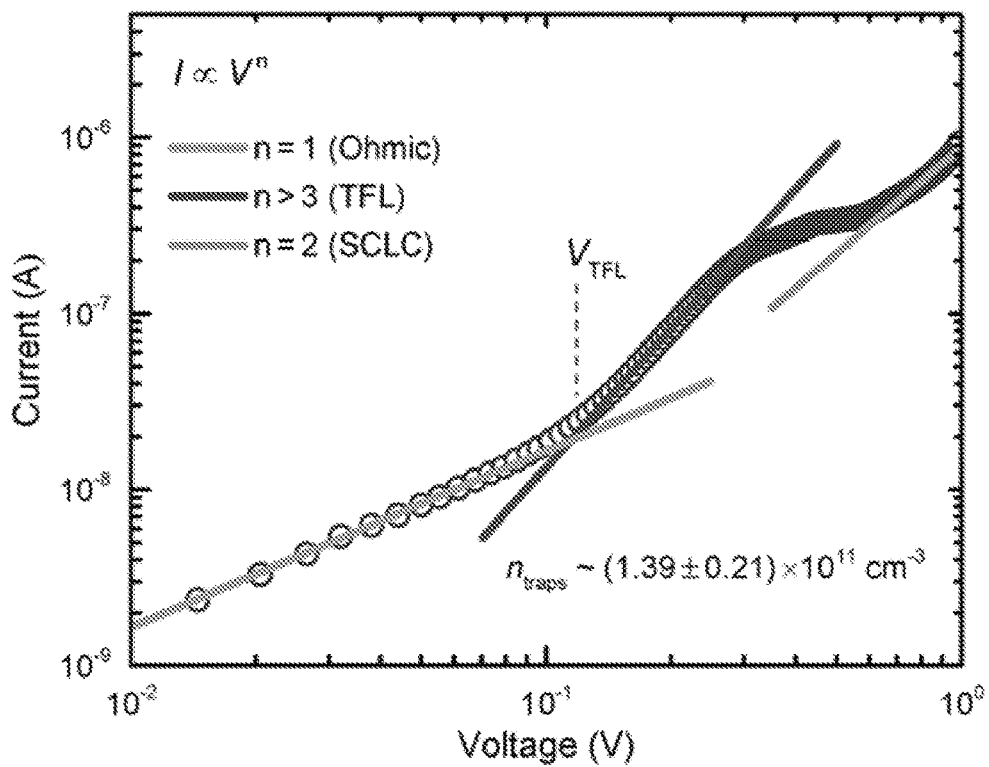
Fig. 1.7

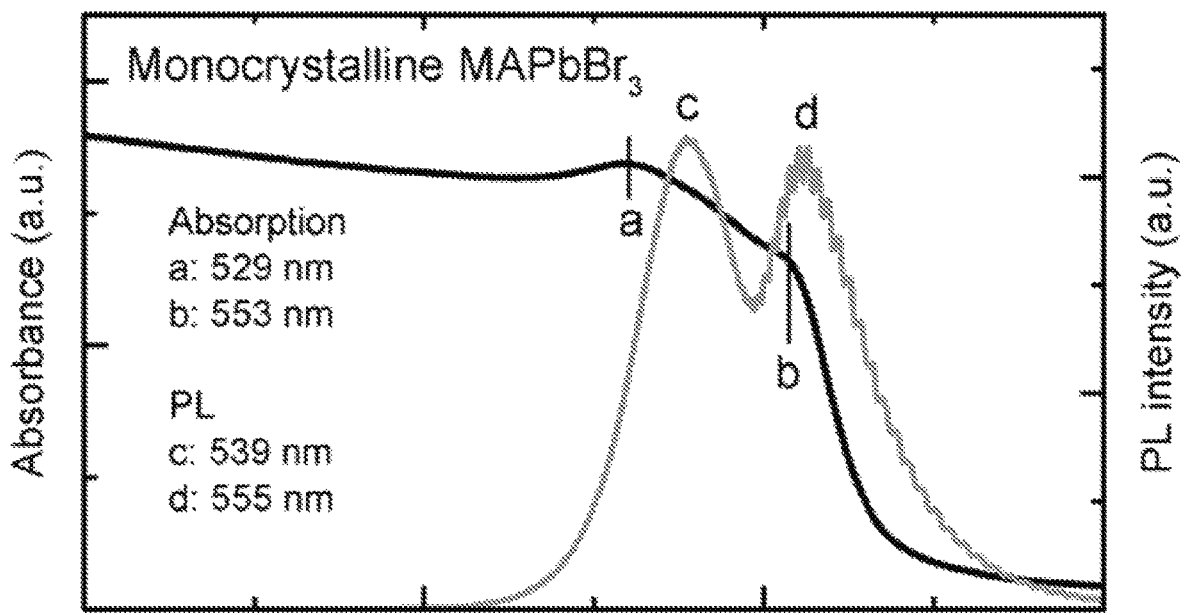
Fig. 1.8A
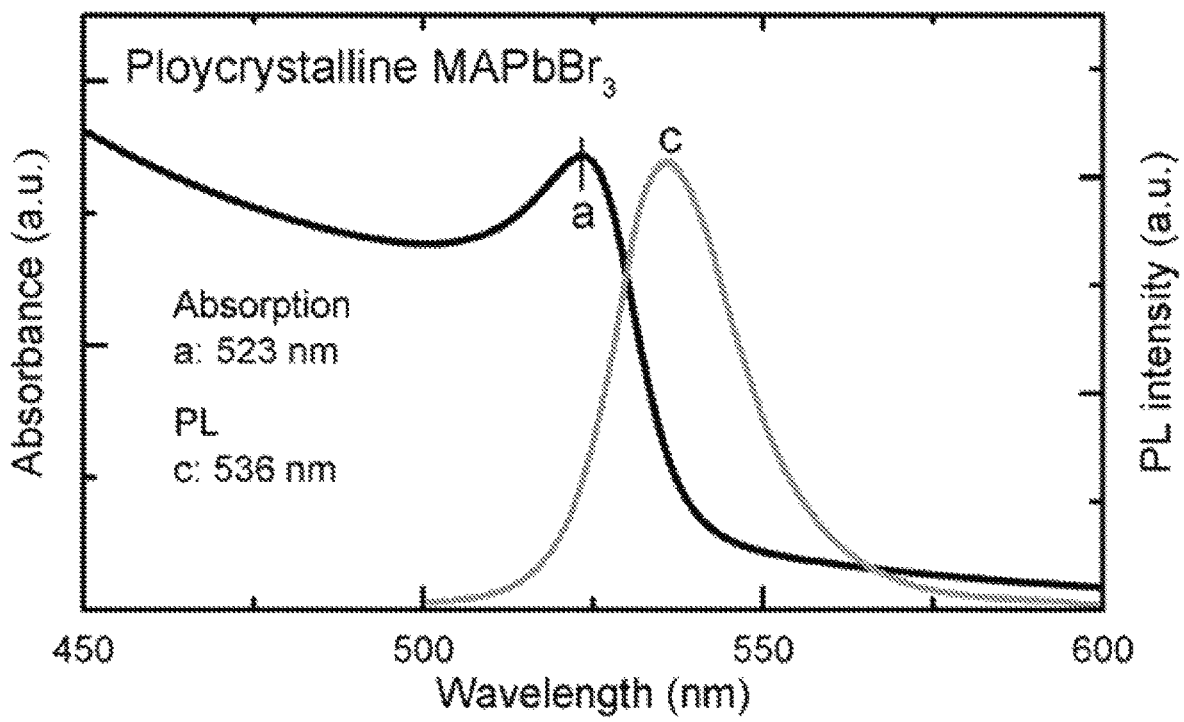
Fig. 1.8B

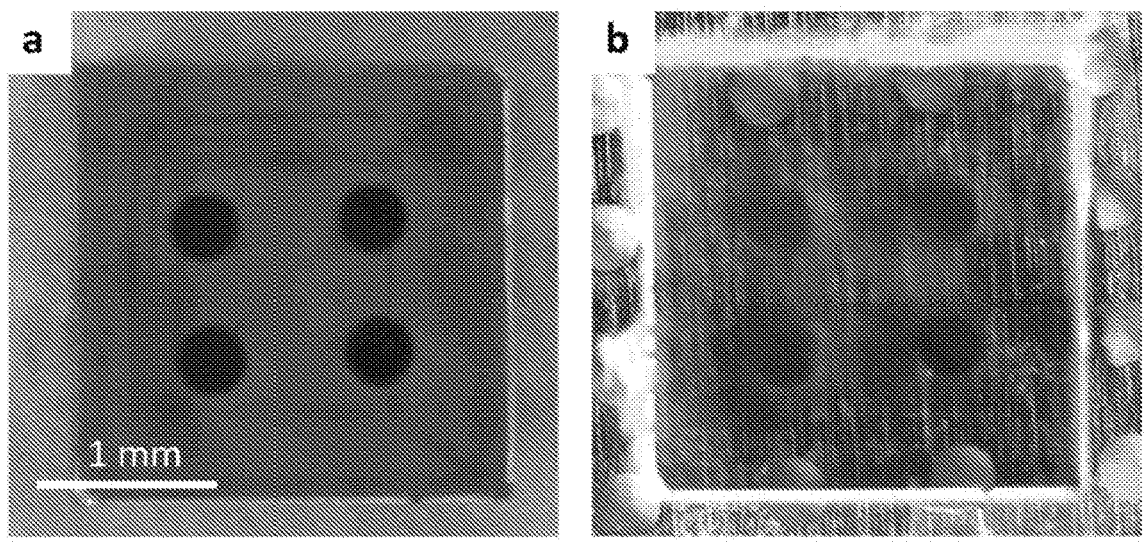
Without aperture mask      With aperture mask
Fig. 1.9A      Fig. 1.9B
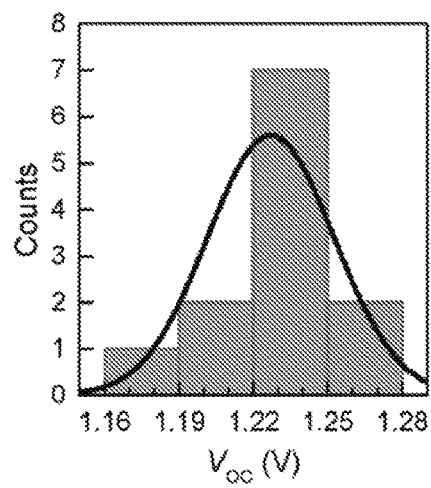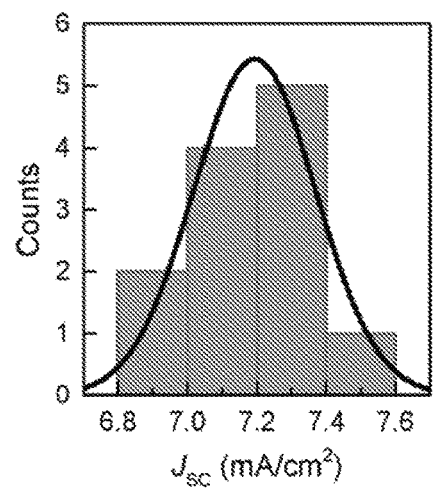
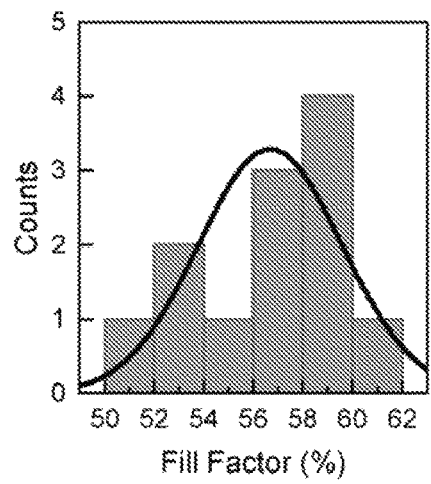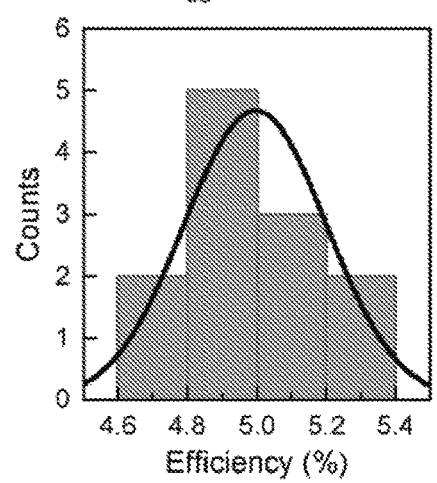
Fig. 1.10

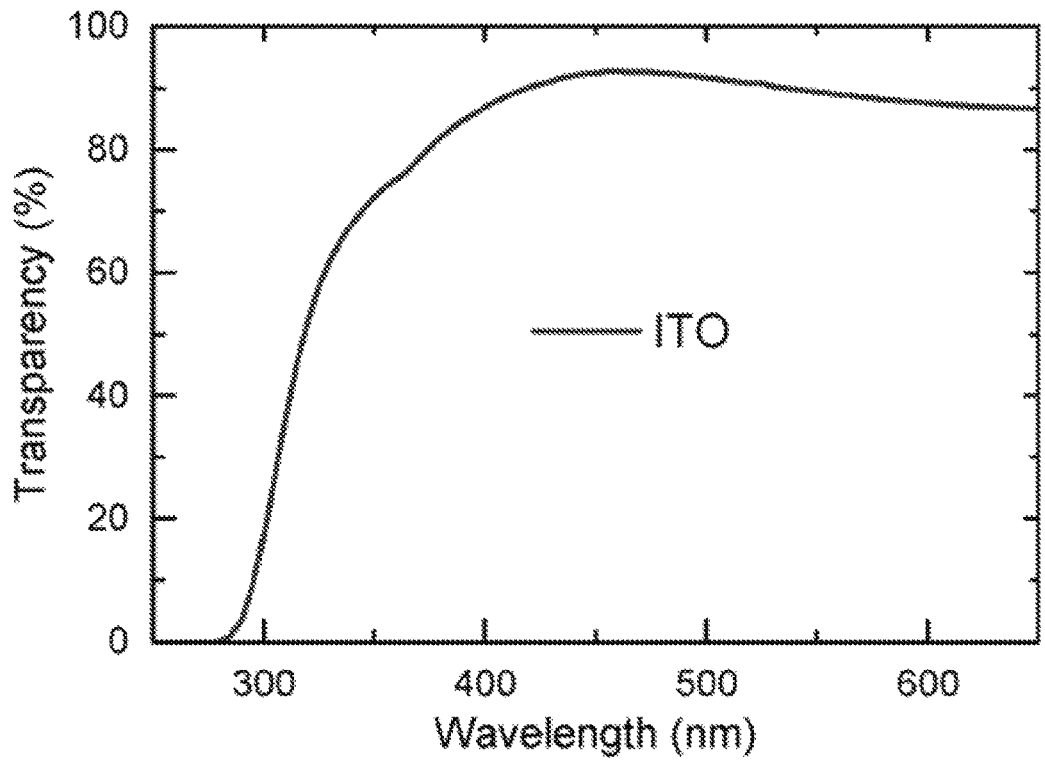
Fig. 1.11
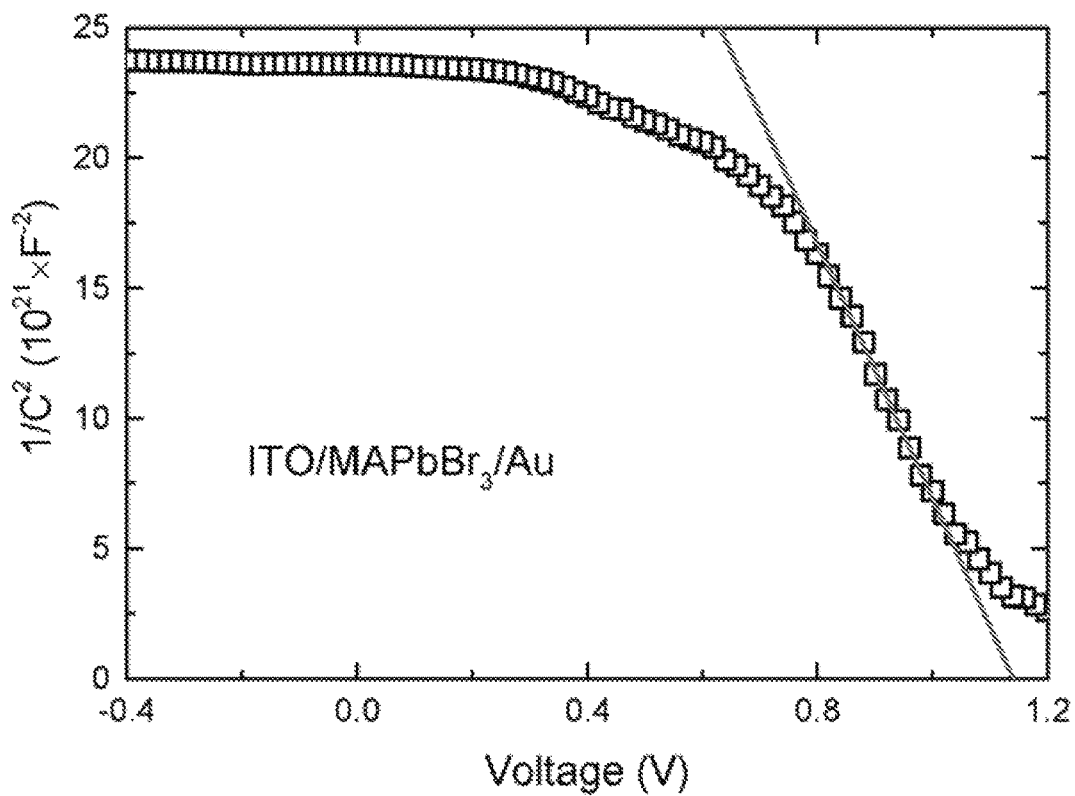
Fig. 1.12

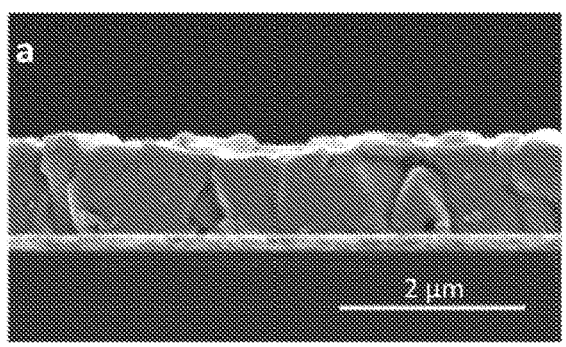
Fig. 1.13A
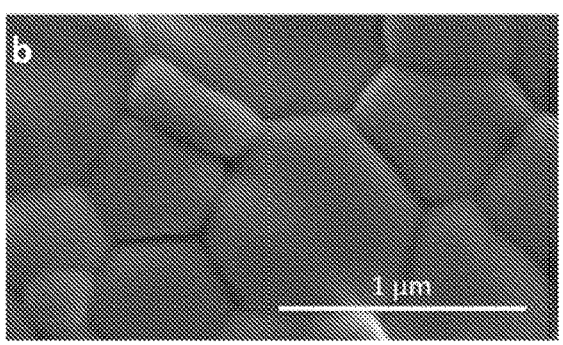
Fig. 1.13B
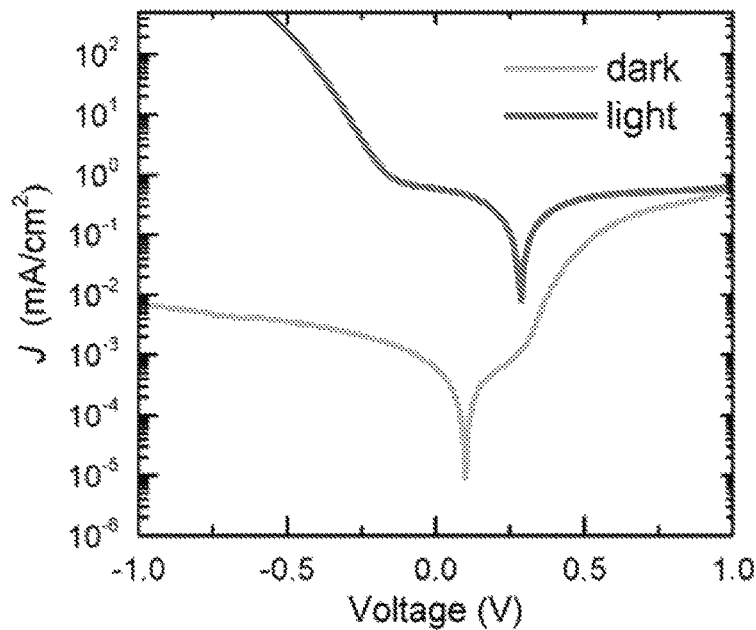
Fig. 1.13C
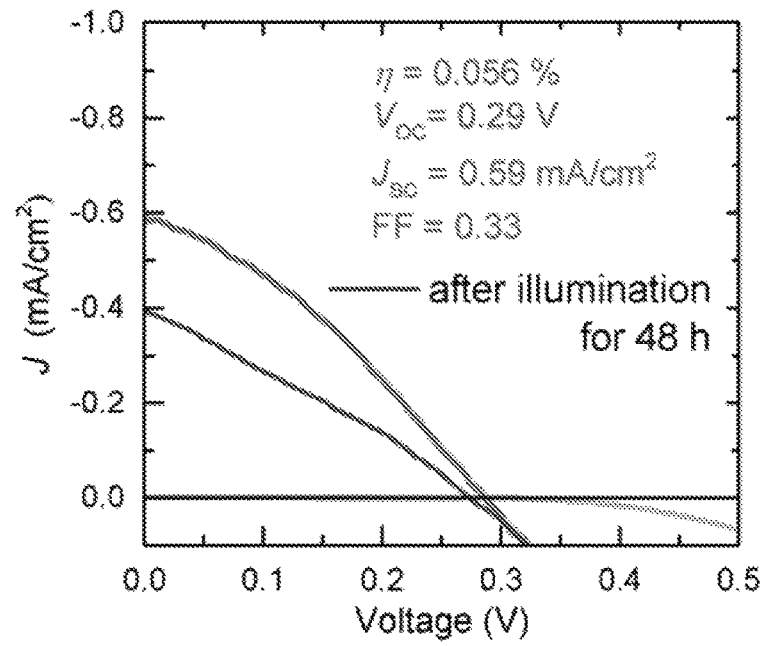
Fig. 1.13D

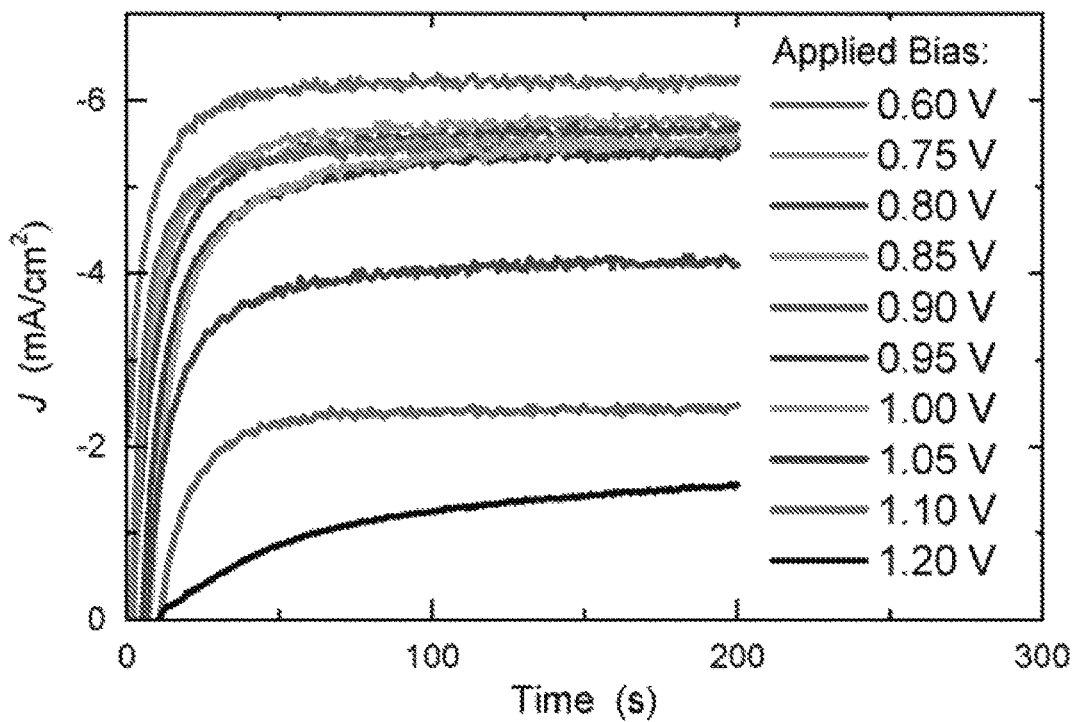
Fig. 1.14
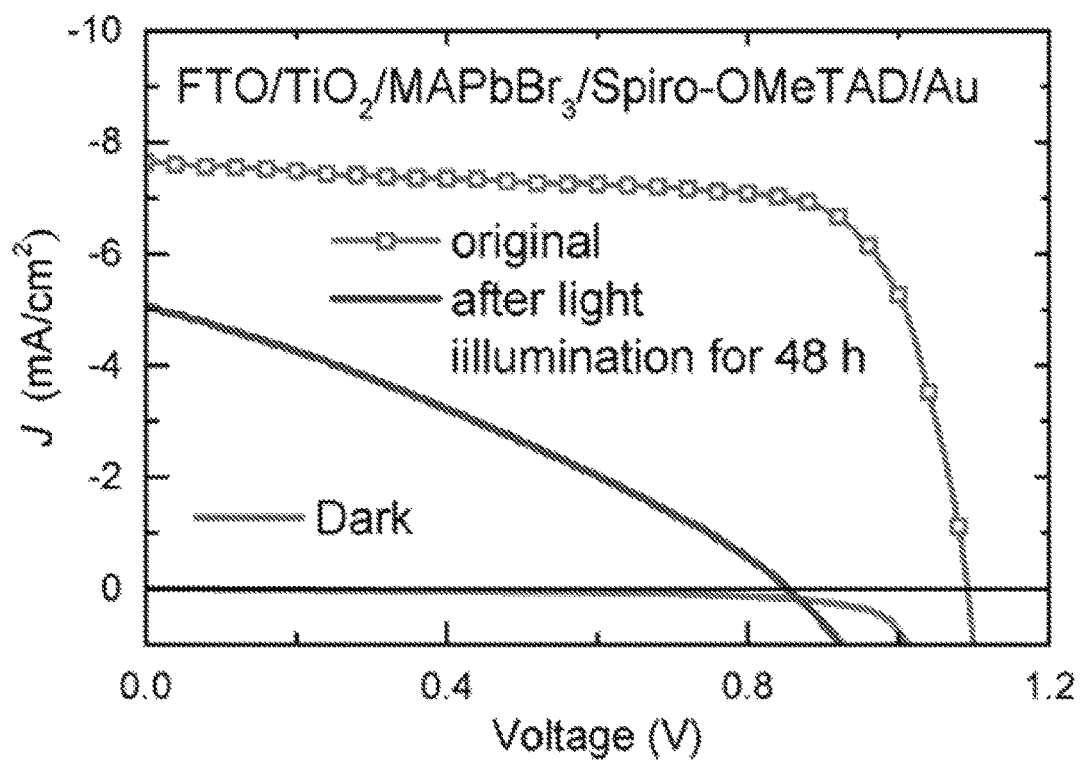
Fig. 1.15

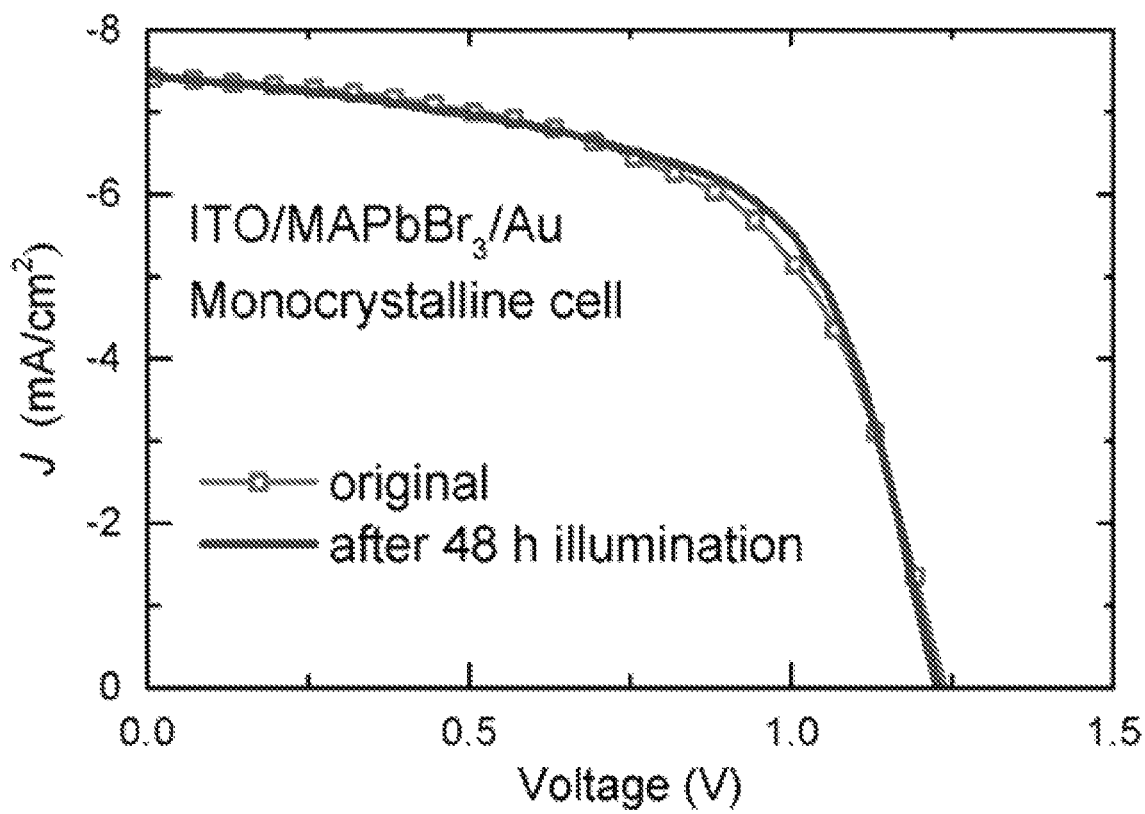
Fig. 1.16
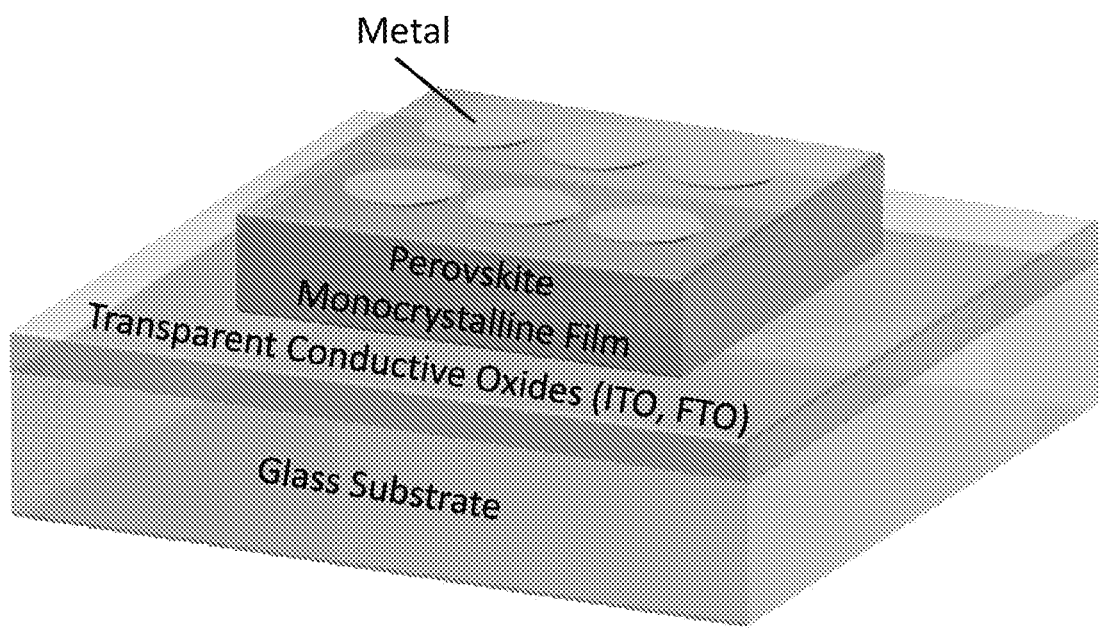
Fig. 1.17

US 10,971,690 B2

SOLAR CELLS, STRUCTURES INCLUDING ORGANOMETALLIC HALIDE PEROVSKITE MONOCRYSTALLINE FILMS, AND METHODS OF PREPARATION THEREOF

CROSS-REFERENCE TO RELATED APPLICATIONS

This application is a National Stage Application of PCT/IB2016/054892, filed on Aug. 15, 2016 in the United States, which claims the benefit of and priority to U.S. Provisional Application Ser. No. 62/208,923, having the title "SOLAR CELLS, STRUCTURES INCLUDING ORGANOMETALLIC HALIDE PEROVSKITE MONOCRYSTALLINE FILMS.

BACKGROUND

The advent of low-trap-density, high-mobility single-crystal semiconductors has usually propelled innovations in optoelectronic device architectures and performance. For hybrid perovskites, such promise is thwarted by the inability to realize their monocrystalline films, which have defied conventional deposition techniques. Thus, there is a need to overcome these obstacles.

SUMMARY

Embodiments of the present disclosure provide for solar cells including an organometallic halide perovskite monocrystalline film, devices including the organometallic halide perovskite monocrystalline film, methods of making organometallic halide perovskite monocrystalline film, and the like.

An embodiment of the present disclosure includes a solar cell or a device, among others, that includes: a substrate; an organometallic halide perovskite monocrystalline film disposed on the substrate; and a metal layer disposed on the organometallic halide perovskite monocrystalline film. In an embodiment, the substrate is selected from: indium tin oxide (ITO)-coated glass, fluoride coated tin oxide (FTO), silicon, metal coated silicon, or a combination thereof. In an embodiment, the organometallic halide perovskite monocrystalline has the following formula: $AMX_3$, wherein A is an organic cation selected from an alkyl-ammonium, M is a cation of a metal, and X is a halide. In an embodiment, $AMX_3$ is selected from: methylammonium lead chloride ($MAPbCl_3$), methylammonium lead iodide ($MAPbI_3$), methylammonium lead bromide ($MAPbBr_3$), formamidinium lead chloride ($FAPbCl_3$), formamidinum lead bromide ($FAPbBr_3$), formamidinum lead iodide ($FAPbI_3$), methylammonium tin chloride ($MASnCl_3$), methylammonium tin bromide ($MASnBr_3$), methylammonium tin iodide ($MASnI_3$), formamidinium tin chloride ($FASnCl_3$), formamidinium tin bromide ($FASnBr_3$), or formamidinium tin iodide ($FASnI_3$).

An embodiment of the present disclosure includes a solar cell or a device, among others, that includes: a substrate, wherein the substrate is selected from: indium tin oxide (ITO)-coated glass, fluoride coated tin oxide (FTO), silicon, metal coated silicon, or a combination thereof; an organometallic halide perovskite monocrystalline film disposed on the substrate, wherein the organometallic halide perovskite monocrystalline has the following formula: $AMX_3$, wherein A is an organic cation selected from an alkyl-ammonium, M is a cation of a metal, and X is a halide; and a metal layer disposed on the organometallic halide perovskite monocrystalline film, wherein the metal layer is selected from Au, Ag, Cu, or a combination thereof.

Other compositions, apparatus, methods, features, and advantages will be or become apparent to one with skill in the art upon examination of the following drawings and detailed description. It is intended that all such additional compositions, apparatus, methods, features and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

FIGS. 1.1A-F illustrate the growth mechanism, optical and cross-section SEM images of the as-grown monocrystalline film. FIG. 1.1A is an optical image of the monocrystalline film. FIG. 1.1B is a cross-section SEM image of a freshly-cut monocrystalline film. FIG. 1.1C-F are illustrations of the CTAC mechanism on a microscopic scale. An ultrasonic pulse induces cavitation in the perovskite solution is shown in FIG. 1.1C) FIG. 1.1D-F illustrates the collapse of the cavitation bubble at the neighborhood of a substrate is asymmetric and results in a high-speed jet towards the substrate, which is the origin of preferential lateral crystallization at the initial stage.

FIGS. 1.2A-E show XRD of tribromide perovskite crystal powder and the monocrystalline films. FIG. 1.2A illustrates XRD pattern of grounded $MAPbBr_3$ perovskite crystal powder. FIG. 1.2B illustrates a ω-26 scan of the monocrystalline film reveals its (001) orientation. FIG. 1.2C illustrates a φ scan of (110) diffraction shows a 4-fold symmetry. FIG. 1.2D illustrate the rocking curve of the (002) diffraction, which gives a FWHM of 0.040°. The rocking curve of a $MAPbBr_3$ bulk crystal is also shown for comparison. FIG. 1.2E is a scheme of the (101) and (001) diffraction plane.

FIGS. 1.3A-E are illustrations of the device architecture, band diagram and characterizations of the monocrystalline solar cell performance. FIG. 1.3A is an illustration of the monocrystalline solar cell architecture. FIG. 1.3B illustrates a band alignment of the device with a high Schottky barrier between Au and $MAPbBr_3$, resulting in an estimated depletion width of ~7 µm. FIG. 1.3C illustrates dark and illuminated J-V curves in log-scale and, while FIG. 1.3D illustrates the linear-scale of the monocrystalline solar cell. FIG. 1.3E illustrates the wavelength-dependent EQE and IQE curves. The calculated integration current is also shown.

FIGS. 1.4A-C demonstrate hysteresis, steady-state power output and stability test. FIG. 1.4A illustrates the reverse and forward scanned J-V curve under illumination of the cell with the 4 µm monocrystalline film. The open circle (triangle) on the reverse (forward) scanned curve marks the maximum power output point. FIG. 1.4B illustrates the steady-state PCE and current output at Vmax=0.93 V. The inset shows the steady-state current under different bias neighboring 0.93 V. FIG. 1.4C illustrates the stability test of the monocrystalline solar cell and two polycrystalline film solar cells under continuous solar illumination for over 48 hours.

FIG. 1.5A is an optical photograph of $MAPbBr_3$ single crystals grown by the antisolvent vapor diffusion crystallization method. FIG. 1.5B illustrates the $MAPbBr_3$ monocrystalline films grown on silicon wafer, FIG. 1.5C illustrates ITO-coated glass and platinum-coated silicon wafer, and gold-coated silicon wafer and glass. FIG. 1.5D is an optical photograph of enormous tiny crystals grown by triggering the ultrasonic pulse at deep supersaturation stage.

FIG. 1.6 provides statistic histograms of MAPbBr$_3$ monocrystalline film thicknesses with different precursor concentrations. The average thickness and minimum thickness are also shown in the inset table.

FIG. 1.7 is an I-V curve measured from the Au/MAPbBr$_3$/Au monocrystalline sandwich structure. Different regions of the logarithmic I-V plot are linearly fitted and the V$_{TFL}$ are also marked in the plot.

FIGS. 1.8A-B are PL and optical absorption curves measured from MAPbBr$_3$ (FIG. 1.8A) monocrystalline film and (FIG. 1.8B) polycrystalline film.

FIGS. 1.9A-B are optical photographs of one monocrystalline solar cell devices (FIG. 1.9A) without and (FIG. 1.9B) with the aperture mask.

FIG. 1.10 shows statistical histograms of MAPbBr$_3$ monocrystalline solar cell parameters extracted from 12 devices.

FIG. 1.11 illustrates wavelength-dependent transparency measured from the bare ITO glass.

FIG. 1.12 is a Mott-Schottky plot of the C-V measurement from the ITO/monocrystalline MAPbBr$_3$/Au solar cell and the fitting curve at the linear regime.

FIGS. 1.13A-B are SEM images measured from the polycrystalline MAPbBr$_3$ film grown on ITO-coated glass (FIG. 1.13A, cross-sectional and FIG. 1.13B, top-morphology). The film includes an entire monolayer of grains with smooth surface morphology and full coverage. The dark and illuminated (AM1.5, 100 mW/cm$^2$) J-V curves of the ITO/polycrystalline MAPbBr$_3$/Au device in (FIG. 1.13C) log-scale and (FIG. 1.13D) linear scale. The corresponding illuminated J-V curve after 48-hour continuous illumination is also shown in FIG. 1.13D.

FIG. 1.14 shows transient current curves under various biases of the cell ITO/monocrystalline MAPbBr$_3$/Au.

FIG. 1.15 provides dark and illuminated J-V curves measured from the mesostructured solar cell. The illuminated J-V curve after 48-hour continuous illumination is also shown.

FIG. 1.16 provides the illuminated J-V curves of the ITO/monocrystalline MAPbBr3/Au solar cell measured before and after 48-hour continuous illumination.

FIG. 1.17 is a schematic showing one possible embodiment of a solar cell containing a perovskite monocrystalline film.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, synthetic organic chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

General Discussion

Embodiments of the present disclosure provide for solar cells including an organometallic halide perovskite monocrystalline film, devices including the organometallic halide perovskite monocrystalline film, methods of making organometallic halide perovskite monocrystalline film, and the like. Use of single crystal organometallic halide perovskites of the present disclosure in a solar cell can lead to enhanced photocurrent generation and/or collection or the overall power conversion efficiency upon use in photovoltaic devices.

Embodiments of the present disclosure may overcome challenges impeding the development of perovskite solar cells in terms of stability and architecture simplification. In particular, embodiments have a very simple architecture (e.g., ITO/AMX$_3$/Au) that can provide superior stability without encapsulation, near-unity internal quantum efficiency, and power conversion efficiencies >5%. These types of results can be achieved by using a cavitation-triggered asymmetric crystallization (CTAC) approach to grow epitaxy-quality, twin-free perovskite monocrystalline films (e.g., having a thickness of about 3 µm).

Embodiments of the present disclosure provide for structures, such as a solar cell, having a substrate, an organometallic halide perovskite monocrystalline film disposed on the substrate, and a metal layer disposed on the organometallic halide perovskite monocrystalline film. FIGS. 1.1B and 1.17 provide a simplified illustration of a solar cell including the organometallic halide perovskite monocrystalline film disposed on a glass substrate. It should be noted that substrates other than glass substrates can be used and these include: any transparent inorganic or organic substrates. Additional component(s) or layer(s) can be included in the solar cell such as electron and hole transport layers.

In an embodiment, the substrate can include a material such as indium-tin oxide (ITO)-coated glass, fluorine doped tin oxide (FTO), silicon, a metal (e.g., Au, Pt, Cu, Ti) coated silicon, and the like. In an embodiment, the substrate can have a thickness of about 0.01 cm and 100 cm, while the length and width can vary depending upon the application.

In an embodiment, the organometallic halide perovskite monocrystalline film can have the following formula: AMX$_3$. In an embodiment, A can be an organic cation such as alkyl-ammonium (e.g., methylammonium (MA)), formamidinium (FA), and 5-ammoniumvaleric acid. In an embodiment, M can be a cation or divalent cation of an element such as Pb, Sn, Cu, Ni, Co, Fe, Mn, Pd, Cd, Ge, or Eu. In an embodiment, X can be a halide such as Cl$^-$, Br$^-$, F$^-$, I$^-$, and At$^-$. The selection of the components of AMX$_3$ is made so that the organometallic halide perovskite has a neutral charge. In an embodiment, alkyl can refer to hydrocarbon moieties having one to six carbon atoms.

In an embodiment, AMX$_3$ can be: methylammonium lead chloride (MAPbCl$_3$), methylammonium lead iodide (MAPbI$_3$), methylammonium lead bromide (MAPbBr$_3$), formamidinium lead chloride (FAPbCl$_3$), formamidinium lead bromide (FAPbBr$_3$), formamidinium lead iodide (FAPbI$_3$), methylammonium tin chloride (MASnCl$_3$), methylammonium tin bromide (MASnBr$_3$), methylammonium tin iodide (MASnI$_3$), formamidinium tin chloride (FASnCl$_3$), formamidinium tin bromide (FASnBr$_3$), or formamidinium tin iodide (FASnI$_3$).

In an embodiment, the organometallic halide perovskite monocrystalline film can have the following dimensions: a thickness of about 300 nm to 50 µm and an area of about 50 to 200 nm. In an embodiment, the length and width can vary depending upon the particular application.

Embodiments of the organometallic halide perovskite monocrystalline film can have one or more of the following characteristics: higher charge carrier mobility than state-of-the-art polycrystalline thin films prepared by other methods, longer lifetime than state-of-the-art crystalline thin films prepared by other methods, lower trap-state density than state-of-the-art crystalline thin films prepared by other methods, or longer diffusion length than state-of-the-art crystalline thin films prepared by other methods.

In an embodiment, the charge carrier mobility can be an order of magnitude larger than state-of-the-art polycrystalline thin films. In an embodiment, the charge carrier mobility can be about 70 to 150 cm$^2$/Vs for MAPbBr$_3$. In an embodiment, the expected charge carrier mobility may be about 100 to 220 cm$^2$/Vs for MAPbI$_3$.

In an embodiment, the lifetime can be an order of magnitude larger than state-of-the-art polycrystalline thin films. In an embodiment, the lifetime can be about 150 to 750 ns for MAPbBr$_3$. In an embodiment, the expected lifetime may be about 300 to 1000 ns for MAPbI$_3$.

In an embodiment, the trap-state density can be several orders of magnitude lower than state-of-the-art polycrystalline thin films. In an embodiment, the trap-state density can be about $1 \times 10^{10}$ cm$^{-3}$ to $3 \times 10^{10}$ cm$^{-3}$ for MAPbBr$_3$. In an embodiment, the expected trap-state density may be about $1 \times 10^{13}$ cm$^{-3}$ to $3 \times 10^{10}$ cm$^{-3}$ for MAPbI$_3$.

In an embodiment, the charge-carrier diffusion length can be an order of magnitude larger than state-of-the-art crystalline thin films. In an embodiment, the charge-carrier diffusion length can be about 7 to 17 µm for MAPbBr$_3$. In an embodiment, the expected charge-carrier diffusion length may be about 10 to 30 µm for MAPbI$_3$.

In an embodiment, the metal layer can be a Au layer, Ag layer, Pt layer, Cu layer, or a combination thereof. The metal layer can cover the entire surface of the organometallic halide perovskite monocrystalline film or portions of the organometallic halide perovskite monocrystalline film. For example, the metal layer can be formed on discrete areas of the organometallic halide perovskite monocrystalline films to form a desired pattern (See FIGURE provided above). In an embodiment the metal layer can have a thickness of about 50 to 200 nm. In an embodiment, the length and width of the metal layer can vary depending upon the application.

In other embodiments, the organometallic halide perovskite monocrystalline films can be included in other structures such as photodetectors, field-emitting transistors, or light-emitting diodes.

Embodiments of the present disclosure provide for methods of making structures (e.g., solar cells) including organometallic halide perovskite monocrystalline film. Alternatively, other methods of making the structures and organometallic halide perovskite monocrystalline film can be used. The following describes one embodiment that can be used to form the structure.

Now referring to one method for making the organometallic halide perovskite monocrystalline film, initially a mixture of a first precursor and a second precursor is disposed in a first reservoir and an antisolvent is disposed in a second reservoir. In an embodiment, the antisolvent vaporizes more readily than the first liquid solvent, so that the antisolvent diffuses into the mixture over time (e.g., hours to days) to form a second mixture. Typically, the vaporization is allowed to occur at room temperature and pressure. In other embodiments, the temperature and/or pressure can be adjusted to control the rate of formation of the organometallic halide perovskite monocrystalline film. At least the first reservoir is exposed to ultrasonic energy to promote heterogeneous nucleation of the perovskite to produce perovskite films that are homogeneous and free of grain boundaries. In particular, the ultrasonic force was introduced to the whole growth set-up for 0.5 to 3 seconds. In an embodiment, the ultrasonic pulse is applied when the perovskite solution reaches a low supersaturation level (e.g., at about 6 hours in advance of crystal formation in the absence of ultrasonic energy application). In an embodiment, the ultrasonic energy can be applied using an ultrasonic bath or the like.

In an embodiment, the first precursor can be a compound that supplies M for the organometallic halide perovskite single crystal (AMX$_3$), where M is defined herein. In an embodiment, the first precursor can be a halide salt of M, for example PbBr$_2$ or SnBr$_2$. In an embodiment, the concentration of the first precursor in the first mixture can be about 3 to 10 weight %.

In an embodiment, the second precursor can be a compound that supplies A for the organometallic halide perovskite single crystal (AMX$_3$), where A is defined herein. In an embodiment, the second precursor can be a halide salt of A. In an embodiment, the organic cation precursor can be methylammonium bromide, methylammonium iodide, methylammonium chloride, formamidinium chloride, formamidinium bromide, or formamidinium iodide. In an embodiment, the concentration of the second precursor in the first mixture can be about 1 to 3 weight %.

The first solvent can be selected from N,N-dimethylformamide (DMF), dimethylsulfoxide (DMSO), gamma-butyrolactone (GBR), or a combination thereof.

In an embodiment, the antisolvent can be a solvent that has a boiling point that is less (e.g., about 50 to 100° C. or about 70° C.) than that of the first solvent. In an embodiment, the anti solvent can be: dichloromethane, chloroform, acetonitrile, toluene, or a combination thereof.

EXAMPLES

Now having described the embodiments of the disclosure, in general, the examples describe some additional embodiments. While embodiments of the present disclosure are described in connection with the example and the corresponding text and FIGURES, there is no intent to limit embodiments of the disclosure to these descriptions. On the contrary, the intent is to cover all alternatives, modifications, and equivalents included within the spirit and scope of embodiments of the present disclosure.

Example 1

BRIEF INTRODUCTION

The advent of low-trap-density, high-mobility single-crystal semiconductors has usually propelled innovations in optoelectronic device architectures and performance. For hybrid perovskites, such promise is thwarted by the inability to realize their monocrystalline films, which have defied conventional deposition techniques. Here, we report a cavitation-triggered asymmetric crystallization (CTAC) approach to grow epitaxy-quality, twin-free perovskite monocrystalline films (down to 3 μm thin). These films enabled us to fabricate perovskite solar cells with the simplest architecture to date, ITO/CH$_3$NH$_3$PbBr$_3$/Au, which offers superior stability (without encapsulation), near-unity internal quantum efficiency, and promising power conversion efficiencies >5% for prototype cells. Our findings raise the possibility of solving key challenges impeding the development of perovskite solar cells in terms of stability and architecture simplification, by working with monocrystalline film devices.

INTRODUCTION

Over the past few years, tremendous progress on perovskite solar cells (PSCs) has been achieved by improving the crystallinity of perovskite polycrystalline films[1-5]. This promising trend may persist for some time, given that polycrystalline films employed in the best PSCs are still orders of magnitude inferior to perovskite single crystals in terms of trap density, carrier mobility and carrier diffusion length[6-10]. Furthermore, even if the processing of polycrystalline films leads to considerably improved grain crystallinity, grain-scale inhomogeneity and reliance on electron and hole conductors in state-of-the-art PSCs would likely result in several deficiencies in terms of stability, cost and manufacturability that would severely hinder the large-scale deployment of PSCs and, more broadly, perovskite optoelectronics[11-13]. A simpler device architecture based on a monocrystalline (i.e. single-crystal) film could offer a unique solution for overcoming the challenges in the development of PSCs. Only monocrystalline films, which are free of grain boundaries, can achieve the upper bounds of lifetimes and diffusion lengths for all carriers homogeneously across the perovskite layer[11], and thus enable the engineering of PSCs with a single junction (e.g. Schottky junction) to efficiently separate and collect photocarriers[14]. Unfortunately, single crystal perovskites are mostly grown in bulk and have yet to be realized in the form of films[6-8], which is an essential prerequisite for practical device applications. The hybrid nature of organometal halide perovskites, i.e. intercalation of volatile and vulnerable organic components with a brittle inorganic framework, makes their monocrystalline films difficult to be achieved by deposition techniques that are well-established for inorganic compounds (e.g., pulsed laser deposition and sputtering) and organic materials (e.g., vapor growth)[16-17].

We were thus motivated to grow hybrid perovskite monocrystalline films on substrates by exploiting the perovskite's propensity to crystallize in solution. However, simple solution-based techniques that crystallize perovskites from saturated precursor solutions produce only free-standing bulk crystals[6-8]. For example, MAPbBr$_3$ crystals grown from supersaturated solutions, such as by slow diffusion of antisolvent vapor into the perovskite solution, were several millimeters in cubic shape and resisted growing on substrates (FIG. 1.5A-D). Likely, the disinclination to heterogeneously nucleate on substrate surfaces resulted from the higher nucleation energy barrier of smooth surfaces[18]. Therefore, we designed a new growth method based on a cavitation-triggered asymmetrical crystallization (CTAC) strategy, which would promote heterogeneous nucleation by providing the necessary energy to overcome the nucleation barrier. Briefly, we introduced a very short ultrasonic pulse (~1 s) to the solution as it reached a low supersaturation level with antisolvent vapor diffusion (See Methods). Promisingly, MAPbBr$_3$ monocrystalline films grew on the surface of various substrates within several hours of the ultrasonic pulse (FIG. 1.5A-D). As shown by the optical photograph (FIG. 1.1A) and the cross-sectional scanning electron microscopy (SEM) image (FIG. 1.1B), these semitransparent films are homogeneous and free of grain boundaries, with thicknesses varying from a few up to tens of micrometers, and lateral dimensions ranging from hundreds of microns to three millimeters. We should note here that growing MAPbI$_3$ monocrystalline films is more challenging due to the large difference in the solubility of MAI and PbI$_2$ and the intrinsic anisotropic growth of tetragonal crystals.

Since the first report on the application of ultrasound in crystallization in 1927[19], the influence of ultrasound on nucleation has been extensively studied[20]. Ultrasound was found to promote nucleation under a low supersaturation level without the aid of seed crystals. The nucleation-stimulus role of ultrasound was assumed to work through a cavitation process, where successive cycles of compression and rarefaction sound waves create and collapse cavities repeatedly. The transient ultrahigh energy release that typically accompanies the cavitation process is expected to induce nucleation by overcoming the nucleation barrier through rapid local cooling rates, increased local pressure and accumulated energy to overcome the nucleation barrier[21]. The collapse of cavities is asymmetric near a solid surface and generates high-speed jets of fluid towards the surface, a mechanical event known as micro-jetting[22]. This process has been utilized for film thinning and reducing particle sizes as a result of the induced strong shearing force[23], which may also contribute to the asymmetric crystal growth we observed here. Potentially, the length scale of localized micro-jetting is also responsible for the limited lateral dimension (up to 3 mm) of the thin crystals. FIGS. 1.1C-F illustrate the entire process. However, the situation is dramatically different when the ultrasonic pulse is introduced at high supersaturation levels, where cavitation triggers excessive nucleation events and competition of ion diffusion to neighboring nuclei would occur, resulting in the growth of a plethora of tiny crystals (FIG. 1.5A-D).

Due to the physics nature of cavitation, the growth of monocrystalline films by CTAC is largely independent of substrate properties. Hence, we were able to grow monocrystalline perovskite films on various substrates such as silicon wafers and ITO-coated glass, as well as sputter-coated gold and platinum on silicon (FIG. 1.5A-D). Using cross-sectional SEM (FIG. 1.1A), we confirmed good mechanical contact at the crystal/substrate interface, which we proved is also a good electrical contact (vide infra). We suggest that the adhesion force between the film and the substrate originates from electrostatic interactions or Van der Waals force[24]. Next, we evaluated the dependence of film thickness on precursor concentrations by comparing approximately 50 discrete as-grown films from precursors of two concentrations, 0.1 M and 0.2 M, after a fixed post-sonication growth time of 10 h. As shown in FIG. 1.6, the minimum (average) film thickness decreased from 6.1 μm to 2.7 μm (22.6 μm to 8.9 μm) by reducing the concentration from 0.2 M to 0.1 M. This dependence is probably related to a higher rate of crystal growth in a more concentrated solution. Thus, the successful growth of films on a wide variety of substrates, good contact at the film/substrate interface and thickness tunability make the solution-based CTAC method highly useful for the fabrication and fundamental studies of perovskite monocrystalline film-based optoelectronic devices.

High-resolution X-ray diffraction (HRXRD) was used to assess the phase purity and single crystal nature of films. The ω-2θ diffraction pattern of powder from crushed as-grown crystals (FIG. 1.2A) confirmed the exclusive presence of the cubic MAPbBr$_3$ phase. The ω-2θ scan of the film (FIG. 1.2B) shows only the (001) diffractions, and the φ-scan of (110)-diffraction (2θ=21.42°, ψ=45°) shows a four-fold symmetry (FIG. 1.2B), clearly confirming that the film is a (001)-oriented, twin-free single crystal with cubic symmetry. We then checked the rocking curve of the (002) diffraction (FIG. 1.2D), and measured a full width at half maximum (FWHM) of 0.040°. As a qualitative indication of crystallinity, this value is comparable to those of high-quality epitaxial perovskite oxide films[16, 25]. Notably, it is also smaller than that of bulk MAPbBr$_3$ perovskite crystals (FWHM=0.044°, FIG. 1.2D), which suggests that the cavitation process, though as an external disturbance, does not deteriorate crystal qualities. The high quality of the monocrystalline films was further corroborated by the space-charge limited current measurement, which shows a low trap density of ~10$^{11}$ cm$^{-3}$ (FIG. 1.7).

Monocrystalline films grown by the CTAC method had thicknesses within the range of carrier diffusion lengths that have been previously measured for bulk MAPbBr$_3$ single crystals[7]. It is thus reasonable to expect that efficient collection of photocarriers could be achieved in photovoltaic devices comprising these films. Therefore, we fabricated solar cells by simply evaporating gold electrodes onto the surface of monocrystalline films grown on ITO-coated glass substrates (see Methods). The device architecture is illustrated in FIG. 1.3A. During photovoltaic characterizations, a bias was applied to the Au electrode while the ITO was grounded, and the simulated air mass 1.5 (AM1.5) sunlight (100 mW/cm$^2$) was illuminated through the ITO. A metal aperture mask of the same pattern as Au electrodes was used to define the working area (FIG. 1.9A-B). According to previous reports on the band diagram and work function of MAPbBr$_3$[26], we speculate that a Schottky junction would form at the interface of perovskite/Au due to the large work function of Au, while the contact between ITO and the perovskite is Ohmic (FIG. 1.3B). As shown in FIG. 1.3C, the direction of the Schottky diode is confirmed by the apparent current rectification of the dark current density-voltage (J-V) curve. Under illumination, the current increases more than three orders of magnitude under small reverse bias, evidencing the sensitivity of our devices to light (FIG. 1.3C).

FIG. 1.3D shows the illuminated J-V curves (linearly scaled) of devices with MAPbBr$_3$ monocrystalline films of various thicknesses. Detailed photovoltaic parameters of these cells can be found in Table 1. Histograms of photovoltaic parameters for 12 devices based on different 4-μm thick films are shown in FIG. 1.10. The statistical data of PCEs show a very small deviation (0.2%) with an average of 5.00%. The best cell shows a fill factor (FF) of 0.58, an open-circuit voltage (V$_{oc}$) of ~1.24 V and a remarkable short-circuit current (J$_{sc}$) of ~7.42 mA/cm$^2$, which yields a PCE of 5.37%. The J$_{sc}$ value is comparable with those of the best polycrystalline tribromide PSCs in literatures[27]. The external quantum efficiency (EQE) spectrum is shown in FIG. 1.3E, from which we calculated an integrated current of 7.15 mA/cm$^2$, in agreement with the measured J$_{sc}$ value. The corresponding internal quantum efficiency (IQE), calculated by dividing the EQE by the transmittance of ITO-coated glass (FIG. 1.11), shows an onset at ~550 nm with a plateau higher than 90% over a wide spectral range and a peak value of ~97% at 507 nm (FIG. 1.3E). It is worth noting that replacing MAPbBr$_3$ monocrystalline films with their iodide counterpart, if realized, would induce a broader absorption spectrum and further increase the efficiency.

TABLE 1.1

Photovoltaic parameters extracted from the illuminated J-V curves of monocrystalline solar cells with various MAPbBr3 film thicknesses.

| Film thickness (μm) | V$_{OC}$ (V) | J$_{SC}$ (mA/cm$^2$) | FF (%) | PCE (%) |
|---|---|---|---|---|
| 4 | 1.24 | 7.42 | 58.4 | 5.37 |
| 7 | 1.11 | 7.19 | 46.4 | 3.70 |
| 12 | 1.03 | 7.09 | 38.6 | 2.82 |
| 60 | 0.94 | 2.27 | 30.6 | 0.65 |

To understand the origin of near-unity IQE achieved through our simple ITO/MAPbBr$_3$/Au structure, we sought to clarify the working principles of the cells. We carried out a capacitance-voltage (C-V) measurement to examine the built-in potential existing in the device[28]. A built-in potential of ~1.2 V was extracted from the Mott-Schottky plot of the C-V measurement (FIG. 1.12), which is in good agreement with the measured V$_{oc}$. We further calculated a self-dopant concentration of ~10$^{12}$ cm$^{-3}$ from the slope of the linear region of the plot. Accordingly, the depletion width was calculated as ~7 μm (See Mott-Schottky analysis section, below). This large depletion width, which is mainly a consequence of the low self-dopant concentration, would ensure the full depletion of electrons within the 4 μm-thick crystal. Under such a built-in field that spans across the perovskite film, photo-excited holes could easily drift to the Au electrode and be collected because of their high mobility. Moreover, the drift of holes is facilitated by the depletion of intrinsic electrons in the crystal, which significantly reduces the probability of charge recombination. Complementary to the extraction of holes, photo-excited electrons are easily collected at the ITO electrode because of the Ohmic contact between ITO and MAPbBr$_3$ as well as the shorter distance they need to travel. Note that such working principles are inferred based on the assumption that excitons dissociate immediately after generation[14].

Considering the discussion above, a major part of the perovskite crystal that is located more than an absorption depth away from the ITO acts as a carrier transporter rather than as a light absorber (FIG. 1.3B). Therefore, if this part of the perovskite film is too thick, it would considerably increase the series resistance and deteriorate the FF, which is clearly evidenced by the J-V curves measured from devices with crystal thicknesses increasing from 4 to 12 μm (FIG. 1.3D). Furthermore, it is worth pointing out that there is no apparent loss of $J_{sc}$ with increasing crystal thickness due to the long diffusion length of ~10 μm and a large depletion width of ~7 μm under short-circuit condition. On the other hand, $V_{oc}$ significantly decreased because of the increased carrier recombination probability under working conditions near the open-circuit voltage, which results from the counteraction of the built-in field with the external bias. Further increasing the thickness to 60 μm, which is far beyond the depletion width and the charge-carrier diffusion length, would substantially increase the recombination rate even under short circuit condition and thus severely reduce $J_{sc}$ to 2.2 mA/cm$^2$.

To determine whether the cell structure could be applied to polycrystalline films, a sequential evaporation method was used to deposit thickness-controllable, pinhole-free MAPbBr$_3$ polycrystalline films (see Methods). Although SEM images (FIG. 1.13A-B) confirm the uniform morphology and complete coverage of as-grown films, we could only avoid device shorting and obtain rectified currents when the thickness of the polycrystalline perovskite layer was no less than ~1 μm (FIG. 1.13C). This observation implies that leakage paths and conductive grain boundaries may exist among closely-packed perovskite crystal grains. As shown in FIG. 1.13D, the solar cell based on a 1 μm-thick polycrystalline film shows a $J_{sc}$ of 0.59 mA/cm$^2$, a $V_{oc}$ of 0.29 V, and an FF of 0.33, to yield a PCE of 0.056%. Although the polycrystalline film was comprised of nearly an entire monolayer of grains, the poor performance of devices based on these films indicates that efficient collection of photocarriers is difficult to achieve with polycrystalline films via a simple Schottky-junction based structure. Our findings suggest that grain boundaries in perovskite thin films are probably less benign than expected and even that the optoelectronic properties of individual grains may be inferior to a single crystal[11].

A notable feature in the illuminated J-V curves of our monocrystalline devices is the considerable hysteresis existing between reverse (from forward bias to short circuit) and forward (from short circuit to forward bias) scans, as presented in FIG. 1.4A. The device based on a 4-μm thick monocrystalline film shows a PCE of 5.37% under reverse scan and 1.47% under forward scan. Therefore, to confirm the reliability of our reported PCEs, we determined the steady-state maximum power output by measuring the transient current output at a given bias and then calculating the corresponding power output[29, 30]. In FIG. 1.4B, a stable $J_{sc}$ of ~5.5 mA/cm$^2$ was achieved at a bias of 0.93 V, which matches the voltage for the maximum power output ($V_{max}$) in the reverse scan, yielding a steady-state PCE of 5.11% that is close to the value obtained from the reverse J-V scan (FIG. 1.4A). The steady-state currents shown in the inset of FIG. 1.4B and FIG. 1.14 at various biases near 0.93 V further confirm that reversely scanned J-V curves provide a reliable estimation of the true device performance.

To date, several theories have been proposed to explain the origin of hysteresis observed in PSCs[29, 31-33]. Here, the PCE obtained from the reversely scanned J-V curve is close to that extracted from the transient current measurement, which agrees well with the trapping-detrapping model[31]. Although MAPbBr$_3$ crystals have an ultra-low bulk trap density, defects and trap states could accumulate at the crystal surface and perovskite/ITO interfaces during crystal growth. Therefore, during a reverse scan, these traps that are filled by carrier injection under forward bias will not affect the carrier transport. On the other hand, in a forward scan, the traps will be initially emptied under short circuit condition, resulting in barriers for efficient carrier transport.

Device stability, a current bottle-neck in the commercialization of PSCs, was expected to improve in our simple-structured solar cells through removing components that may cause instability issues[13, 34, 35]. Hence, we tested the stability of these cells by monitoring the photocurrent of the monocrystalline cell while continuously exposed to simulated AM1.5 sunlight (100 mW/cm$^2$) in an ambient atmosphere (55% relative humidity, room temperature), without encapsulation. Strikingly, the photocurrent shows no degradation under $V_{max}$ in our test of over 48 hours (FIG. 1.4C). For comparison, we fabricated two polycrystalline cells: one with the same structure as the monocrystalline cell (Poly-1); and the other with a mesostructure of FTO/TiO$_2$/MAPbBr$_3$/2,2',7,7'-tetrakis[N,N-di(4-methoxyphenyl)amino]-9,9'-spirobifluorene (Spiro-OMeTAD)/Au (Poly-2). The normalized current of both cells shows distinct degradation at different rates. J-V curves of the three cells before and after illumination are provided in FIGS. 1.13, 1.15 and 1.16. The superior stability of monocrystalline devices over polycrystalline film PSCs may have several origins. First, hybrid perovskite polycrystalline films have been reported to be sensitive to water due to a hygroscopic organic component, while perovskite single crystals have been found to be stable for over one month in ambient conditions. Compared with polycrystalline films, monocrystalline films are free of grain boundaries, which are supposed to be the infiltration and corrosion sites for moistures. Secondly, the absence of a TiO$_2$ layer may also eliminate some potential detrimental effects in the device[13]. And finally, the organic hole-conductor layer, which is absent in monocrystalline cells, has been known to cause instability issues for PSCs under exposure to moisture and oxygen[34, 35]. The two latter factors may explain the difference in current degradation rates between the two polycrystalline solar cells.

In summary, as a result of our novel CTAC strategy, we reported the first successful growth and characterization of hybrid perovskite monocrystalline films. Only by utilizing such high-quality monocrystalline films, we were able to achieve near-unity IQE in a very simple prototype cell of ITO/MAPbBr$_3$ (4 μm)/Au architecture, and consequently an ultra-stable PCE of >5%. The observed trend of efficiency evolving with crystal thickness suggests that efficiencies comparable or even higher than state-of-the-art polycrystalline PSCs could be achieved through this structure by further thinning monocrystalline films. As a major breakthrough in the rapidly emerging research area of PSCs, our work revealed the formation of a built-in field across a micron-thick monocrystalline film using a mere Schottky junction, which contributes to the nearly 100% separation and collection of photocarriers without any hole- and electron-transport layers. In comparison, the cells of high-quality polycrystalline films using an analogous device structure were drastically inferior in terms of device performance and stability, further indicating the superiority of monocrystalline films.

Materials

MABr powder and $TiO_2$ paste was purchased from Dyesol. Spiro-OMeTAD was purchased from Borun New Material Technology. All the other chemicals and solvents were purchased from Sigma Aldrich and meet the ACS reagent grade. ITO coated glass (8-12 Ω/sq) were purchased from Sigma Aldrich. Fluorine doped tin oxide (FTO) coated glass (15 Ω/sq) were purchased from Pilkington.

Monocrystalline film growth.

The growth set-up was the same as previously reported for perovskite single crystal growth[7]. Briefly, perovskite precursor solution of equimolar MABr and $PbBr_2$ in N,N-dimethylformamide (DMF), typically 10 mL, was loaded in a Pyrex crystallizing dish (80 mm×40 mm) with substrates placed in the bottom, which was then placed in a larger crystallizing dish (125 mm×65 mm) with dichloromethane loaded as antisolvent. Both crystallizing dishes were sealed with aluminum foils while the cover of the inner dish was punctured a 0.5 mm-diameter hole to let the antisolvent vapor slowly diffuse into the perovskite solution. To grow monocrystalline films, the whole set-up was transferred to an ultrasonic bath (Branson 5510) and a short ultrasonic pulse (<1 s) was triggered when the perovskite solution reached a low supersaturation level, which was roughly estimated to be 6 hours in advance of the moment that crystals came out of the solution in the absence of ultrasound.

Monocrystalline film characterization.

SEM images were taken with a Quanta 600 FEG (FEI Co.). XRD measurements were carried out by Panalytical X'pert Pro equipped with a Cu Kα radiation source (λ=1.5406 Å). The absorption spectra were captured with a Varian Cary 6000i spectrometer in a transmittance mode. Aramis Raman Spectroscopy (Horiba Scientific, Japan) was used to record the photoluminescence spectra excited by a 473 nm laser in a 180° reflection setup.

Device fabrication.

We fabricated three types of solar cells with two different configurations in this work. For the monocrystalline device, 100 nm Au electrodes of a circular shape (390 μm in diameter) were deposited through metal shadow mask onto $MAPbBr_3$ monocrystalline films that were grown on ITO-coated glass by thermal evaporation. For the second type of PSCs, by using the same configuration, a polycrystalline $MAPbBr_3$ film was instead deposited on ITO-coated glass by a two-step vapor deposition method. A $PbBr_2$ film was thermally evaporated onto ITO-coated glass and annealing in MABr vapor at 130° C. under vacuum for a certain time in a vacuum desiccator followed to convert $PbBr_2$ into perovskite[36]. The thickness of the final perovskite film was controlled through the initial $PbBr_2$ film thickness. Finally, Au electrodes of the same geometry as monocrystalline devices were evaporated on top. The mesostructured device was fabricated by successively depositing a compact $TiO_2$ layer, a 200 nm mesoporous $TiO_2$ layer, $MAPbBr_3$, Spiro-OMeTAD and 100 nm Au electrodes on patterned, cleaned FTO-coated glass. Specifically for the deposition of $MAPbBr_3$ film, a solution of 40 weight % perovskite precursor was prepared with equimolar MABr and $PbBr_2$ in DMF at 60° C. stirring overnight and then adding 20 μL HBr (48 weight % in water). $MAPbBr_3$ film was deposited by spin-coating the as-prepared solution at 3000 rpm for 3 min and annealed at 100° C. for 10 min. The detailed procedures for depositing the compact/mesoporous $TiO_2$ layer and Spiro-OMeTAD layer were published elsewhere[37]. The active device area is 0.2 $cm^2$.

Device characterization.

To characterize cell performance, simulated air-mass 1.5 (AM1.5) sunlight with a power intensity of 100 mW/$cm^2$ (Newport Oriel Sol3A) was used as light source. J-V curves were recorded with a Keithley 4200 sourcemeter with a scan rate of 0.2 V/s. The EQE and IQE curves were measured by a Newport Oriel IQE-200 system equipped with a 300 W xenon light source, a monochromator and a Keithley 2400 sourcemeter. The capacitance-voltage (C-V) curve was measured by Agilent E4980A precision LCR meter.

Space-Charge-Limited Conduction Analysis

The current-voltage (I-V) measurements were carried out on the Au/$MAPbBr_3$/Au monocrystalline sandwich structure. As shown in FIG. 1.7, the logarithmic plot of I-V curve clearly exhibit a trap-controlled space-charge-limited conduction (SCLC) behavior, including three distinct regions with different slopes[1]. At small voltages, the device shows linear current response, i.e. Ohmic conduction. Further increasing the voltage, the current exhibits a rapid nonlinear rise (the onset voltage is defined as $V_{TFL}$) with I∝$V^n$ (n>3) at the trap-filled limit (TFL) regime. In the region of high voltages, a quadratic response, i.e. I∝$V^2$, was observed, which follows the Child's law. The concentrations of in-gap deep trap states ($N_{dt}$) can be estimated by the equation $V_{TFL}=eN_{dt}d^2/(2\varepsilon\varepsilon_0)$, where d is the film thickness, e and $\varepsilon_0$ represent the elementary charge and vacuum permittivity, respectively. The relative dielectric constant of $MAPbBr_3$ ε is estimated as 25.5[2]. As a result, the $N_{dt}$ was calculated as $(1.39\pm0.21)\times10^{11}$ $cm^{-3}$.

Photoluminescence and Optical Absorption Measurements

The existence of surface states in the monocrystalline film was corroborated by the absorption and photoluminescence (PL) spectra of the film. As shown in FIG. 1.8A, the absorption peak at 529 nm and PL peak at 539 nm agree well with those captured from polycrystalline thin films (FIG. 1.8B), while absorption edge at 553 nm and PL at 555 nm match those of bulk crystals[7]. According to our previous experience, collecting the PL and absorption spectra of bulk single crystals while keeping them in the mother liquor could avoid the crystal surface being corroded and reconstructed. However, this set-up was difficult to achieve in the situation of characterizing monocrystalline films grown on substrates. Interestingly, resonance feature is observable over the PL peak at 555 nm, which should come from the Fabry-Perot interference of the direct emission light of the bulk and the emission light reflected by the substrate[39]. This phenomenon further confirms the uniform nature of the monocrystalline films.

Mott-Schottky Analysis of $MAPbBr_3$/Au Schottky Diode

The capacitance-voltage (C-V) measurements can be used to determine the built-in potential, depletion width and carrier concentration[40]. According to the depletion approximation, the junction capacitance is given by $$C = A\varepsilon\varepsilon_0/W \qquad (1)$$

A is the device area, $\varepsilon$ and $\varepsilon_0$ refer to dielectric constant (25.5 for MAPbBr$_3$) and the vacuum permittivity, respectively. The depletion width, W, of a Schottky junction is given by $$W = \sqrt{\frac{2\varepsilon\varepsilon_0(V_{bi} - V)}{eN_D}} \qquad (2)$$

where e is the elementary charge, $N_D$ is the dopant density, V is the applied bias and $V_{bi}$ is the built-in potential. From equation (1) and (2) we can get $$C^{-2} = \frac{2(V_{bi} - V)}{A^2\varepsilon\varepsilon_0 N_D} \qquad (3)$$

From which we express the dopant density as $$N_D = \frac{1}{A^2} \frac{2}{e\varepsilon\varepsilon_0 \frac{d}{dV}\left(\frac{1}{C^2}\right)} \qquad (4)$$

The Mott-Schottky plot of $C^{-2}$ versus V is shown in FIG. 1.10. According to equation (3), a $V_{bi}$ of ~1.2 eV can be obtained from the linear extrapolation of $C^{-2}$-V curve to zero. The self-dopant density of $7.15 \times 10^{13}$ cm$^{-3}$ can be calculated by the linear fitting slope of $C^2$-V curve. From equation (2) the depletion width W can be calculated as 6.88 μm.

REFERENCES FOR EXAMPLE 1

1. M. M. Lee, J. Teuscher, T. Miyasaka, T. N. Murakami, H. J. Snaith, Efficient Hybrid Solar Cells Based on Meso-Superstructured Organometal Halide Perovskites. *Science* 338, 643-647 (2012).
2. J. Burschka, N. Pellet, S. J. Moon, R. Humphry-Baker, P. Gao, M. K. Nazeeruddin, M. Gratzel, Sequential deposition as a route to high-performance perovskite-sensitized solar cells. *Nature* 499, 316-319 (2013).
3. M. Liu, M. B. Johnston, H. J. Snaith, Efficient planar heterojunction perovskite solar cells by vapour deposition. *Nature* 501, 395-398 (2013).
4. N. J. Jeon, J. H. Noh, Y. C. Kim, W. S. Yang, S. Ryu, S. I. Seok, Solvent engineering for high-performance inorganic-organic hybrid perovskite solar cells. *Nat. Mater.* 13, 897-903 (2014).
5. W. Nie, H. Tsai, R. Asadpour, J.-C. Blancon, A. J. Neukirch, G. Gupta, J. J. Crochet, M. Chhowalla, S. Tretiak, M. A. Alam, H.-L. Wang, A. D. Mohite, High-efficiency solution-processed perovskite solar cells with millimeter-scale grains. *Science* 347, 522-525 (2015).
6. Q. Dong, Y. Fang, Y. Shao, P. Mulligan, J. Qiu, L. Cao, J. Huang, Electron-hole diffusion lengths >175 μm in solution-grown CH$_3$NH$_3$PbI$_3$ single crystals. *Science* 347, 967-970 (2015).
7. D. Shi, V. Adinolfi, R. Comin, M. Yuan, E. Alarousu, A. Buin, Y. Chen, S. Hoogland, A. Rothenberger, K. Katsiev, Y. Losovyj, X. Zhang, P. A. Dowben, O. F. Mohammed, E. H. Sargent, O. M. Bakr, Low trap-state density and long carrier diffusion in organolead trihalide perovskite single crystals. *Science* 347, 519-522 (2015).
8. M. I. Saidaminov, A. L. Abdelhady, B. Murali, E. Alarousu, V. M. Burlakov, W. Peng, I. Dursun, L. Wang, Y. He, G. Maculan, A. Goriely, T. Wu, O. F. Mohammed, O. M. Bakr, High-quality bulk hybrid perovskite single crystals within minutes by inverse temperature crystallization. *Nat. Commun.* 6, 7586 (2015).
9. S. D. Stranks, G. E. Eperon, G. Grancini, C. Menelaou, M. J. Alcocer, T. Leijtens, L. M. Herz, A. Petrozza, H. J. Snaith, Electron-Hole Diffusion Lengths Exceeding 1 Micrometer in an Organometal Trihalide Perovskite Absorber. *Science* 342, 341-344 (2013).
10. G. Xing, N. Mathews, S. Sun, S. S. Lim, Y. M. Lam, M. Gratzel, S. Mhaisalkar, T. C. Sum, Long-Range Balanced Electron- and Hole-Transport Lengths in Organic-Inorganic CH$_3$NH$_3$PbI$_3$. *Science* 342, 344-347 (2013).
11. D. W. deQuilettes, S. M. Vorpahl, S. D. Stranks, H. Nagaoka, G. E. Eperon, M. E. Ziffer, H. J. Snaith, D. S. Ginger, Impact of microstructure on local carrier lifetime in perovskite solar cells. *Science* 348, 683-686 (2015).
12. A. Mei, X. Li, L. Liu, Z. Ku, T. Liu, Y. Rong, M. Xu, M. Hu, J. Chen, Y. Yang, M. Gratzel, H. Han, A hole-conductor-free, fully printable mesoscopic perovskite solar cell with high stability. *Science* 345, 295-298 (2014).
13. T. Leijtens, G. E. Eperon, S. Pathak, A. Abate, M. M. Lee, H. J. Snaith, Overcoming ultraviolet light instability of sensitized TiO$_2$ with meso-superstructured organometal trihalide perovskite solar cells. *Nat. Commun.* 4, 2885 (2013).
14. S. D. Stranks, H. J. Snaith, Metal-halide perovskites for photovoltaic and light-emitting devices. *Nat. Nanotechnol.* 10, 391-402 (2015).
15. J. Wang, J. B. Neaton, H. Zheng, V. Nagarajan, S. B. Ogale, B. Liu, D. Viehland, V. Vaithyanathan, D. G. Schlom, U. V. Waghmare, N. A. Spaldin, K. M. Rabe, M. Wuttig, R. Ramesh, Epitaxial BiFeO$_3$ Multiferroic Thin Film Heterostructures. *Science* 299, 1719-1722 (2003).
16. C. B. Eom, R. J. Cava, R. M. Fleming, J. M. Phillips, R. B. vanDover, J. H. Marshall, J. W. P. Hsu, J. J. Krajewski, W. F. Peck, Single-Crystal Epitaxial Thin Films of the Isotropic Metallic Oxides Sr$_{1-x}$Ca$_x$RuO$_3$ (0≤x≤1). *Science* 258, 1766-1769 (1992).
17. C. Reese, Z. N. Bao, Organic single-crystal field-effect transistors. *Mater. Today* 10, 20-27 (2007).
18. J. J. De Yoreo, P. G. Vekilov, Principles of Crystal Nucleation and Growth. *Rev. Mineral. Geochem.* 54, 57-93 (2003).
19. A. P. Kapustin, The effects of ultrasound on the kinetics of crystallization. (Springer, 1963).
20. L. H. Thompson, L. K. Doraiswamy, Sonochemistry: Science and Engineering. *Ind. Eng. Chem. Res.* 38, 1215-1249 (1999).
21. G. Ruecroft, D. Hipkiss, T. Ly, N. Maxted, P. W. Cains, Sonocrystallization: The Use of Ultrasound for Improved Industrial Crystallization. *Org. Process Res. Dev.* 9, 923-932 (2005).
22. M. S. Plesset, R. B. Chapman, Collapse of an initially spherical vapour cavity in the neighbourhood of a solid boundary. *J. Fluid Mech.* 47, 283-290 (1971).
23. S. A. Elder, Cavitation Microstreaming. *J. Acoust. Soc. Am.* 31, 54-64 (1959).
24. H. Alves, A. S. Molinari, H. X. Xie, A. F. Morpurgo, Metallic conduction at organic charge-transfer interfaces. *Nat. Mater.* 7, 574-580 (2008).
25. L. F. Wang, X. L. Tan, P. F. Chen, B. W. Zhi, B. B. Chen, Z. Huang, G. Y. Gao, W. B. Wu, Annealing assisted substrate coherency and high-temperature antiferromagnetic insulating transition in epitaxial La$_{0.67}$Ca$_{0.33}$MnO$_3$/NdGaO$_3$(001) films. *AIP Adv.* 3, 052106 (2013).
26. P. Schulz, E. Edri, S. Kirmayer, G. Hodes, D. Cahen, A. Kahn, Interface energetics in organo-metal halide perovskite-based photovoltaic cells. *Energy Environ. Sci.* 7, 1377-1381 (2014).
27. J. H. Heo, D. H. Song, S. H. Im, Planar CH$_3$NH$_3$PbBr$_3$ Hybrid Solar Cells with 10.4% Power Conversion Efficiency, Fabricated by Controlled Crystallization in the Spin-Coating Process. *Adv. Mater.* 26, 8179-8183 (2014).
28. A. Guerrero, E. J. Juarez-Perez, J. Bisquert, I. Mora-Sero, G. Garcia-Belmonte, Electrical field profile and doping in planar lead halide perovskite solar cells. *Appl. Phys. Lett.* 105, 133902 (2014).
29. H. J. Snaith, A. Abate, J. M. Ball, G. E. Eperon, T. Leijtens, N. K. Noel, S. D. Stranks, J. T. W. Wang, K. Wojciechowski, W. Zhang, Anomalous Hysteresis in Perovskite Solar Cells. *J. Phys. Chem. Lett.* 5, 1511-1515 (2014).
30. J. A. Christians, J. S. Manser, P. V. Kamat, Best Practices in Perovskite Solar Cell Efficiency Measurements. Avoiding the Error of Making Bad Cells Look Good. *J. Phys. Chem. Lett.* 6, 852-857 (2015).
31. R. S. Sanchez, V. Gonzalez-Pedro, J.-W. Lee, N.-G. Park, Y. S. Kang, I. Mora-Sero, J. Bisquert, Slow Dynamic Processes in Lead Halide Perovskite Solar Cells. Characteristic Times and Hysteresis. *J. Phys. Chem. Lett.* 5, 2357-2363 (2014).
32. R. Gottesman, E. Haltzi, L. Gouda, S. Tirosh, Y. Bouhadana, A. Zaban, E. Mosconi, F. De Angelis, Extremely Slow Photoconductivity Response of CH$_3$NH$_3$PbI$_3$ Perovskites Suggesting Structural Changes under Working Conditions. *J. Phys. Chem. Lett.* 5, 2662-2669 (2014).
33. Z. Xiao, Y. Yuan, Y. Shao, Q. Wang, Q. Dong, C. Bi, P. Sharma, A. Gruverman, J. Huang, Giant switchable photovoltaic effect in organometal trihalide perovskite devices. *Nat. Mater.* 14, 193-198 (2015).
34. J. Yang, B. D. Siempelkamp, D. Liu, T. L. Kelly, Investigation of CH$_3$NH$_3$PbI$_3$ Degradation Rates and Mechanisms in Controlled Humidity Environments Using in Situ Techniques. *ACS Nano* 9, 1955-1963 (2015).
35. W. H. Nguyen, C. D. Bailie, E. L. Unger, M. D. McGehee, Enhancing the Hole-Conductivity of Spiro-OMeTAD without Oxygen or Lithium Salts by Using Spiro(TFSI)$_2$ in Perovskite and Dye-Sensitized Solar Cells. *J. Am. Chem. Soc.* 136, 10996-11001 (2014).
36. Q. Chen, H. Zhou, Z. Hong, S. Luo, H.-S. Duan, H.-H. Wang, Y. Liu, G. Li, Y. Yang, Planar Heterojunction Perovskite Solar Cells via Vapor-Assisted Solution Process. *J. Am. Chem. Soc.* 136, 622-625 (2014).
37. A. Bera, K. Wu, A. Sheikh, E. Alarousu, O. F. Mohammed, and T. Wu, Perovskite Oxide SrTiO3 as an Efficient Electron Transporter for Hybrid Perovskite Solar Cells. *J. Phys. Chem. C* 118, 28494-28501 (2014).
38. M. A. Lampert, *Phys. Rev.* 103, 1648 (1956).
39. C. Hums, T. Finger, T. Hempel, J. Christen, A. Dadgar, A. Hoffmann, A. Krost, Fabry-Perot effects in InGaN/GaN heterostructures on Si-substrate. *J. Appl. Phys.* 101, 033113 (2007).
40. J. M. Luther, M. Law, M. C. Beard, Q. Song, M. O. Reese, R. J. Ellingson, and A. J. Nozik, *Nano Lett.* 8, 3488 (2008).

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim:
1. A solar cell, comprising:
a substrate;
an organometallic halide perovskite monocrystalline film having a (001) orientation grown on the substrate by cavitation-triggered asymmetric crystallization, wherein the organometallic halide perovskite monocrystalline film includes methylammonium lead bromide (MAPbBr$_3$); and
a metal layer disposed on the organometallic halide perovskite monocrystalline film.
2. The solar cell of claim 1, wherein the substrate includes one or more of indium tin oxide (ITO)-coated glass, fluoride coated tin oxide (FTO), silicon, and metal coated silicon.
3. The solar cell of claim 1, wherein the metal layer is one or more of Au, Ag, and Cu.
4. The solar cell of claim 1, wherein the organometallic halide perovskite single crystal film has a thickness of about 300 nm to 50 µm and wherein the metal layer has a thickness of about 50 nm to 200 nm.
5. A device, comprising:
a substrate, wherein the substrate includes one or more of indium tin oxide (ITO)-coated glass, fluoride coated tin oxide (FTO), silicon, and metal coated silicon;
an organometallic halide perovskite monocrystalline film having a (001) orientation grown on the substrate by cavitation-triggered asymmetric crystallization, wherein the organometallic halide perovskite monocrystalline film includes methylammonium lead bromide (MAPbBr$_3$); and
a metal layer disposed on the organometallic halide perovskite monocrystalline film, wherein the metal layer includes one or more of Au, Ag, and Cu.
6. The solar cell of claim 1, wherein an adhesion force between the substrate and organometallic halide perovskite monocrystalline film includes electrostatic interactions, Van der Waals forces, or a combination thereof.

* * * * *